United States Patent
Tai et al.

(10) Patent No.: US 12,310,093 B2
(45) Date of Patent: May 20, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chun-Liang Tai, Hsinchu (TW); Chun-Hsiang Fan, Hsinchu (TW); Ta-Wei Lin, Hsinchu (TW); Shih-Hsiang Chiu, New Taipei (TW); Kuo-Bin Huang, Hsinchu County (TW); Chieh-Chun Chiang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 457 days.

(21) Appl. No.: 17/740,385

(22) Filed: May 10, 2022

(65) Prior Publication Data

US 2023/0369134 A1    Nov. 16, 2023

(51) Int. Cl.
*H10D 84/03* (2025.01)
*H01L 21/02* (2006.01)
(Continued)

(52) U.S. Cl.
CPC ..... *H10D 84/038* (2025.01); *H01L 21/02532* (2013.01); *H01L 21/26506* (2013.01);
(Continued)

(58) Field of Classification Search
CPC ....... H01L 21/823878; H01L 21/02532; H01L 21/26506; H01L 21/3065;
(Continued)

(56) References Cited

U.S. PATENT DOCUMENTS

| 8,796,666 B1 | 8/2014 | Huang et al. |
| 8,815,712 B2 | 8/2014 | Wan et al. |

(Continued)

OTHER PUBLICATIONS

J. W. Ma et al., "Effects of Surface Chemical Structure on the Mechanical Properties of Si1-xGex Nanowires", American Chemical Society Publications, Feb. 19, 2013, pp. 1118-1125.
(Continued)

*Primary Examiner* — Karen Kusumakar
*Assistant Examiner* — Adam S Bowen
(74) *Attorney, Agent, or Firm* — JCIPRNET

(57) ABSTRACT

A method of manufacturing a semiconductor device is provided. The method comprises the following steps of forming a first semiconductor layer over a substrate, the first semiconductor layer comprising a first semiconductor material; etching the first semiconductor layer to form a first recess; forming a second semiconductor layer in the first recess, the second semiconductor layer comprising a second semiconductor material different from the first semiconductor material; etching the first semiconductor layer and the second semiconductor layer to form a first fin comprising the second semiconductor layer and the first semiconductor layer; forming an insulation material over the substrate, wherein a top surface of the insulation material is flush with a top surface of the first fin; performing an implantation process on the first fin to form an implant region near the top surface of the first fin; and partially removing the insulation material to form shallow trench isolation regions, wherein the first fin is sandwiched by two adjacent shallow trench isolation regions.

20 Claims, 29 Drawing Sheets

(51) Int. Cl.
*H01L 21/265* (2006.01)
*H01L 21/3065* (2006.01)
*H10D 64/01* (2025.01)
*H10D 84/01* (2025.01)
*H10D 84/85* (2025.01)

(52) U.S. Cl.
CPC ....... *H01L 21/3065* (2013.01); *H10D 64/017* (2025.01); *H10D 84/0167* (2025.01); *H10D 84/017* (2025.01); *H10D 84/0188* (2025.01); *H10D 84/0193* (2025.01); *H10D 84/853* (2025.01)

(58) Field of Classification Search
CPC ..... H01L 21/823807; H01L 21/823814; H01L 21/823821; H01L 27/0924; H01L 29/66545; H01L 21/823481; H01L 29/1054; H01L 21/31144; H01L 21/76224; H01L 29/165; H01L 29/7848; H10D 84/038; H10D 64/017; H10D 84/0167; H10D 84/017; H10D 84/0188; H10D 84/0193; H10D 84/853; H10D 64/252; H10D 84/903; H10D 18/01; H10D 18/60; H10D 62/133; H10D 62/221; B65D 83/141; A23B 2/783; A23B 11/29
See application file for complete search history.

(56) References Cited

U.S. PATENT DOCUMENTS

| | | | |
|---|---|---|---|
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 2016/0218104 | A1* | 7/2016 | Wen ................ H01L 21/823807 |
| 2020/0043927 | A1* | 2/2020 | Wang ................ H01L 21/3065 |

OTHER PUBLICATIONS

M. Darnon et al., "Undulation of sub-100nm porous dielectric structures: A mechanical analysis", American Institute of Physics, Appl. Phys. Lett. 91, 194103 (2007), Nov. 6, 2007, pp. 1-4.

B. Holländer et al., "Wet Chemical Etching of Si, Si1-xGex, and Ge in HF:H2O2:CH3COOH", Journal of The Electrochemical Society, 157(6) H643-H646 (2010), Apr. 23, 2010, pp. 643-646.

* cited by examiner

SEMICONDUCTOR DEVICE AND MANUFACTURING METHOD THEREOF

BACKGROUND

As the semiconductor devices keep scaling down in size, three-dimensional multi-gate structures, such as the fin-type field effect transistor (FinFET), have been developed to replace planar complementary metal-oxide-semiconductor (CMOS) devices. A characteristic of the FinFET device lies in that the structure has one or more silicon-based fins that are wrapped around by the gate to define the channel of the device. The gate wrapping structure further provides better electrical control over the channel. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 to FIG. 11A, FIG. 12A to FIG. 19B are cross-sectional views illustrating various stages of a method of manufacturing FinFETs in accordance with some embodiments.

DETAILED DESCRIPTION

Figure 1:
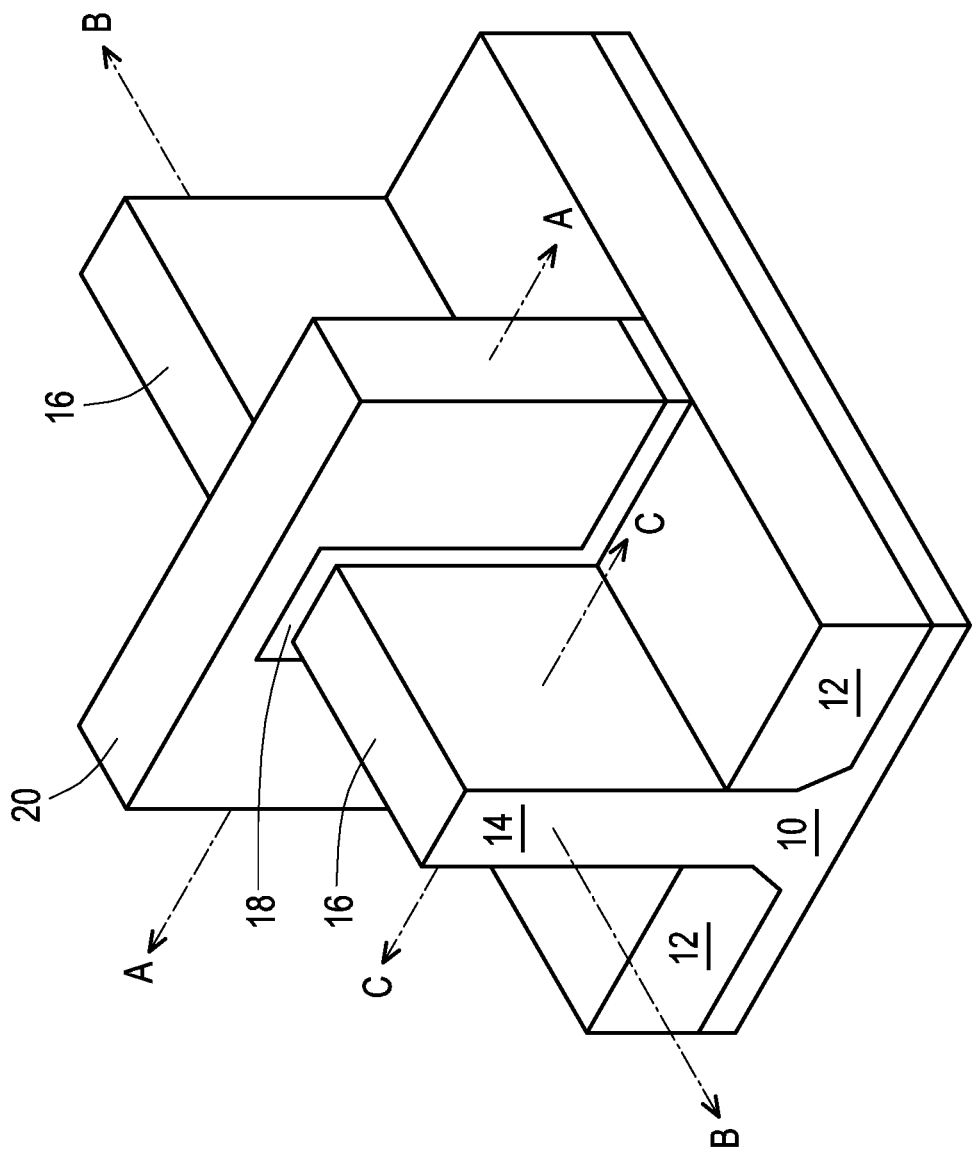
FIG. 1 illustrates an example of a FinFET in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates an example of a FinFET in a three-dimensional view for reference, in accordance with some embodiments. The FinFET comprises a fin 14 on a substrate 10 (e.g., a semiconductor substrate). Isolation regions 12 are disposed in the substrate 10, and the fin 14 protrudes above and from between neighboring isolation regions 12. Although the isolation regions 12 are described and illustrated as being separate from the substrate 10 in FIG. 1, as used herein the term "substrate" may be used to refer to just the semiconductor substrate or a semiconductor substrate inclusive of the isolation regions 12. A gate dielectric layer 18 is along sidewalls and over a top surface of the fin 14, and a gate electrode 20 is over the gate dielectric layer 18. Source/drain regions 16 are disposed in opposite sides of the fin 14 with respect to the gate dielectric layer 18 and gate electrode 20. FIG. 1 further illustrates reference cross-sections that are used in later figures. Cross-section A-A is along a longitudinal axis of the gate electrode 20 and in a direction, for example, perpendicular to the direction of current flow between the source/drain regions 16 of the FinFET. Cross-section B-B is perpendicular to the cross-section A-A and is along a longitudinal axis of the fin 14 and in a direction of, for example, a current flow between the source/drain regions 16 of the FinFET. Cross-section C-C is parallel to the cross-section A-A and extends through one of the source/drain regions 16 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIG. 2 to FIG. 11A, FIG. 12A to FIG. 19B are cross-sectional views illustrating intermediate stages in the manufacturing method of FinFETs in accordance with some embodiments. FIG. 11B is a top view illustrating a stage of a method of manufacturing the FinFET in FIG. 11A. FIG. 2 to FIG. 10 illustrate reference cross-section A-A illustrated in FIG. 1, except for multiple fins/FinFETs. In FIG. 11A through FIG. 19B, figures ending with an "A" designation are illustrated along reference cross-section A-A illustrated in FIG. 1, except for multiple fins/FinFETs, and figures ending with a "B" designation are illustrated along reference cross-section B-B illustrated in FIG. 1. FIG. 15C and FIG. 15D are illustrated along reference cross-section C-C illustrated in FIG. 1.

Figure 2:
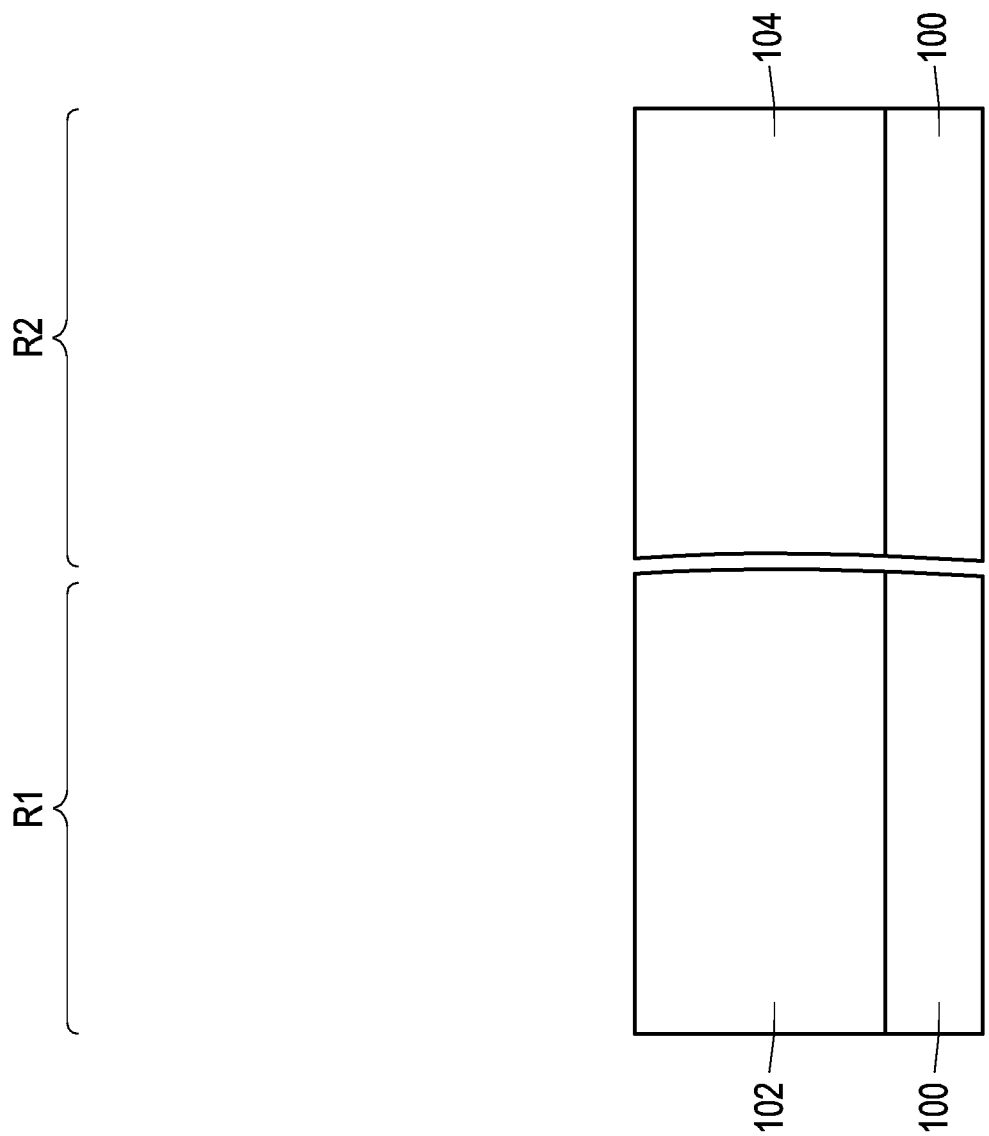

Referring to FIG. 2, a substrate 100 having an n-well region 102 and a p-well region 104 formed therein is provided. The substrate 100 may be a semiconductor substrate, such as a bulk semiconductor, a semiconductor-on-insulator (SOI) substrate, or the like, which may be doped (e.g., with a p-type dopant or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, which is typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, as shown in FIG. 2, the substrate 100 has a first region R1 and a second region R2. The first region R1 may be for forming p-type devices, such as PMOS transistors, e.g., p-type FinFETs, and the second region R2 may be for forming n-type devices, such as NMOS transistors, e.g., n-type FinFETs. As such, the first region R1 may be referred as a PMOS region, and the second region R2 may be referred as a NMOS region. In some embodiments, the first region R1 is physically separated from the second region R2 (as illustrated by a divider), and any number of device features (e.g., other active devices, doped regions, isolation structures, etc.) may be disposed between the first region R1 and the second region R2. In some alternative embodiments, the first region R1 and the second region R2 are adjacent to each other.

The n-well region 102 may be formed in the substrate 100 by covering the p-well region 104 with a mask (such as a photoresist, an oxide, or the like) and performing an ion implantation process on the n-well region 102. N-type dopants, such as arsenic or phosphorus ions, may be implanted into the n-well region 102. The p-well region 104 may be formed in the substrate 100 by covering the n-well region 102 with a mask (such as a photoresist, an oxide, or the like) and performing an ion implantation process on the p-well region 104. P-type dopants, such as boron or $BF_2$ ions, may be implanted into the p-well region 104. In some embodiments, the n-well region 102 may comprise n-type doped silicon and the p-well region 104 may comprise p-type doped silicon.

Figure 3:
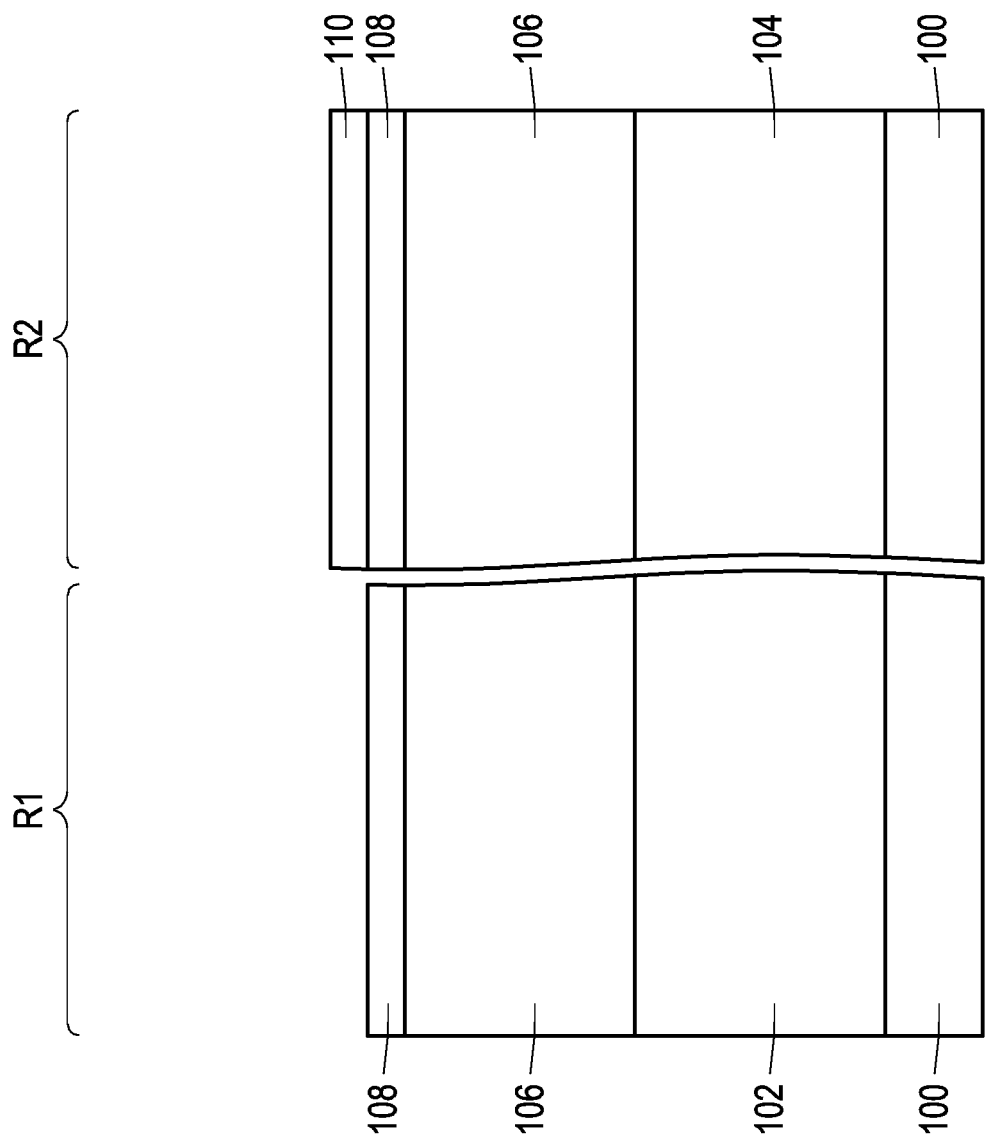

Referring to FIG. 3, a first epitaxial layer 106 is formed over the n-well region 102 and the p-well region 104, a mask layer 108 is formed over the first epitaxial layer 106, and a patterned photoresist layer 110 is formed on the mask layer 108 in the second region R2. The first epitaxial layer 106 may be a channel in a subsequently formed NMOS device and may be used to reduce dislocation defects in a subsequently formed second epitaxial layer 114. The first epitaxial layer 106 may be formed by a process such as epitaxial growth or the like. The first epitaxial layer 106 may comprise a material such as silicon (e.g., single-crystalline/ monocrystalline silicon) or the like. The first epitaxial layer 106 may have a lattice constant similar to or the same as the lattice constants of the n-well region 102 and the p-well region 104. As explained in greater detail below, the first epitaxial layer 106 will be patterned to form a fin in the second region 100B (e.g., for NMOS devices) and will be used as a seed layer to form another epitaxial layer in the first region 100A (e.g., for PMOS devices). In some embodiments, the first epitaxial layer 106 has a thickness of between about 1 Å and about 300 Å.

The mask layer 108 may be formed by a process such as chemical vapor deposition (CVD), atomic layer deposition (ALD), or the like. The mask layer 108 may comprise a material such as silicon dioxide, silicon nitride, or the like. The patterned photoresist layer 110 may be deposited using a spin-on technique or the like and patterned by exposing the photoresist material to a patterned energy source (e.g., a patterned light source, an electron beam (e-beam) source, or the like) and exposing the patterned photoresist material to a developer solution. The developer solution may remove a portion of the photoresist material, such that at least a portion of the mask layer 108 is exposed. In detail, the patterned photoresist layer 110 is disposed in the second region R2 without extending into the first region R1. For example, as shown in FIG. 3, the patterned photoresist layer 110 is patterned such that the patterned photoresist layer 110 extends over the p-well region 104 without extending over the n-well region 102. However, in various other embodiments, the patterned photoresist layer 110 may overlap at least a portion of the n-well region 102 or may not completely cover the p-well region 104.

Figure 4:
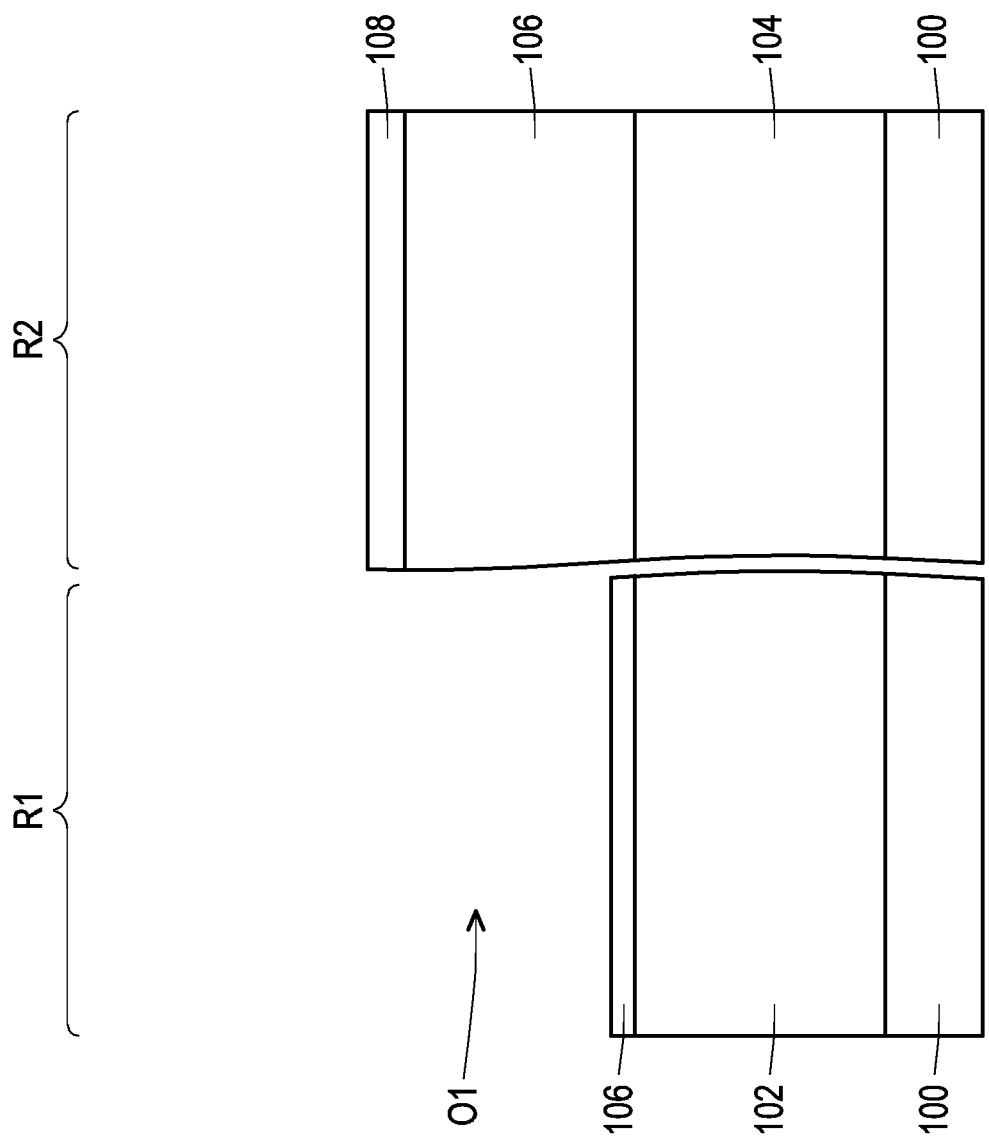

Referring to FIG. 4, the mask layer 108 is etched using the patterned photoresist layer 110 as a mask and the first epitaxial layer 106 is etched using the mask layer 108 as a mask to form a first opening O1. The mask layer 108 and the first epitaxial layer 106 may be etched by suitable etch processes, such as anisotropic etch processes. In some embodiments, the mask layer 108 and the first epitaxial layer 106 are etched by dry etch processes such as reactive-ion etching (RIE), neutral-beam etching (NBE), combinations thereof, or the like. After the mask layer 108 is etched, the patterned photoresist layer 110 may be removed using suitable photoresist stripping techniques, such as chemical solvent cleaning, plasma ashing, dry stripping and/or the like. The patterned photoresist layer 110 may be removed before or after etching the first epitaxial layer 106. As illustrated in FIG. 4, the first opening O1 is formed over the n-well region 102, without extending over the p-well region 104. However, in some embodiments, the first opening O1 may extend over at least a portion of the p-well region 104. As illustrated in FIG. 4, a portion of the first epitaxial layer 106 remains below the first opening O1. That is to say, after forming the first opening O1, a portion of the first epitaxial layer 106 is exposed by the first opening O1. The portion of the first epitaxial layer 106 remaining over the n-well region 102 may be used to grow a second epitaxial layer 114 (discussed below in reference to FIG. 5). In some embodiments, the portion of the first epitaxial layer 106 remaining may have a thickness of between about 1 Å and about 299 Å after forming the first opening O1. In some embodiments, the depth of the first opening O1 is between about 1 Å and about 299 Å.

Figure 5:
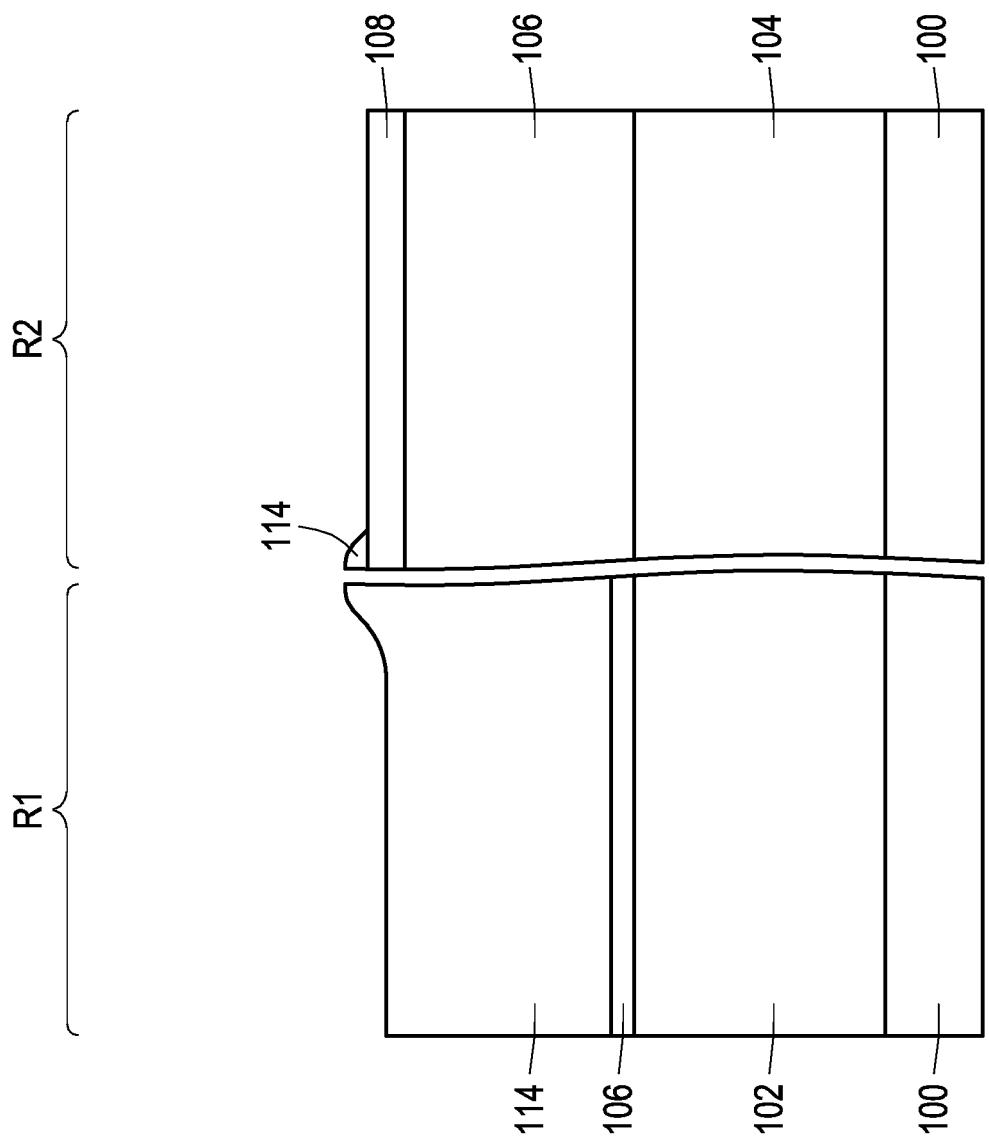

Referring to FIG. 5, a second epitaxial layer 114 is formed on the first epitaxial layer 106 exposed by the first opening O1. The second epitaxial layer 114 may be formed by a process such as epitaxial growth or the like. The second epitaxial layer 114 may comprise a material such as silicon germanium (SiGe) (e.g., single-crystalline/monocrystalline silicon germanium), or the like. In embodiments in which the first region R1 is a PMOS region, the second epitaxial layer 114 may comprise a material having a greater lattice constant than the lattice constant of the first epitaxial layer 106. For example, in some embodiments, the second epitaxial layer 114 may comprise SiGe. SiGe comprises a lower bandgap than Si, allowing for greater hole mobility for subsequently formed PMOS devices. In some embodiments, the germanium content of SiGe in the second epitaxial layer 114 is about 5% to about 50%.

As illustrated in FIG. 5, the second epitaxial layer 114 may fill the first opening O1 such that the top surface of the second epitaxial layer 114 is disposed above the top surface of the first epitaxial layer 106. The second epitaxial layer 114 may be formed to a thickness such that a subsequent planarization process of the first epitaxial layer 106 and the second epitaxial layer 114 will create a planar surface. In some embodiments, at least a portion of the second epitaxial layer 114 extends over the mask layer 108, as shown in FIG. 5.

Figure 6:
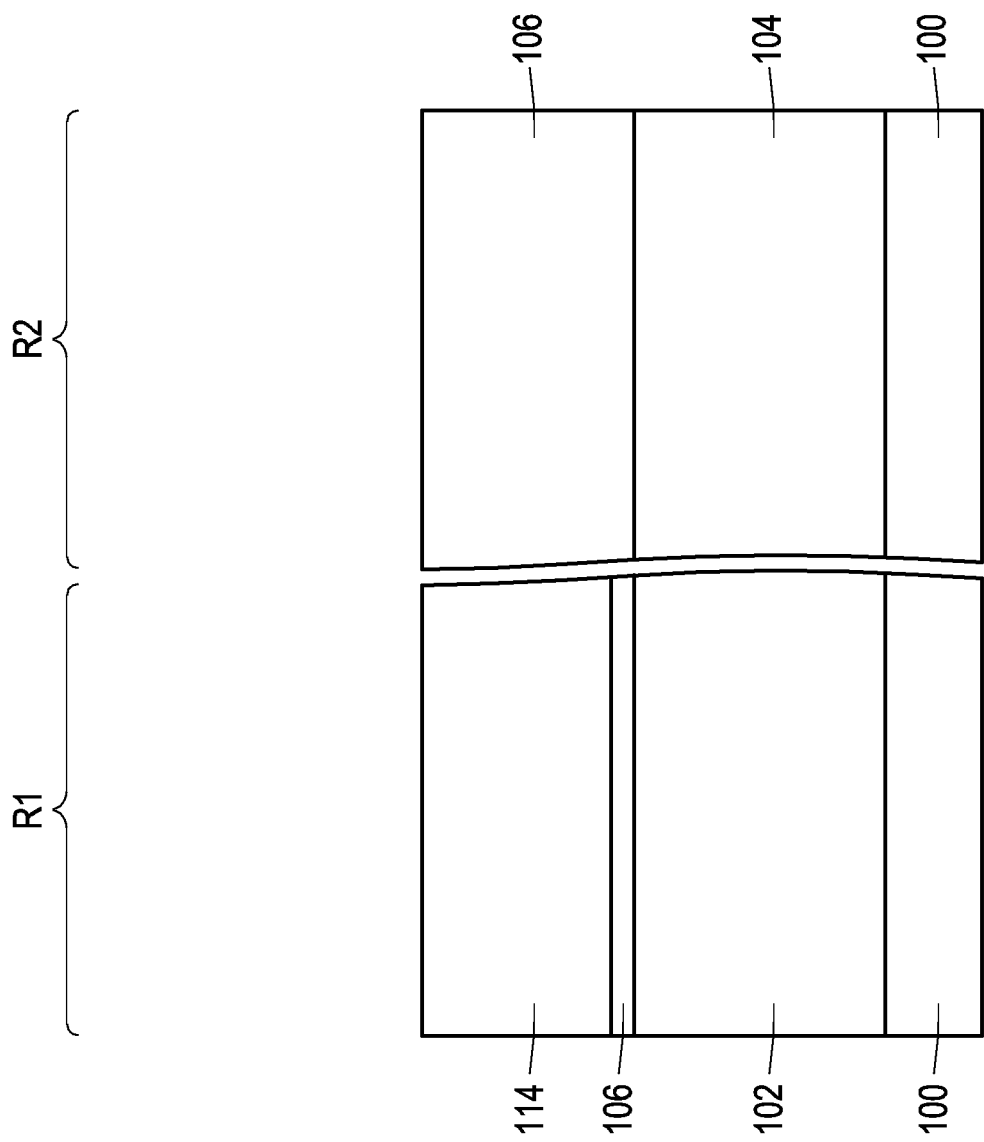

Referring to FIG. 6, the mask layer 108 is removed and a planarization process is performed on the first epitaxial layer 106 and the second epitaxial layer 114. The mask layer 108 may be removed using a suitable etch process, such as a wet etch process (e.g., dilute hydrofluoric (dHF) acid, or the like). The first epitaxial layer 106 and the second epitaxial layer 114 may be planarized by any suitable planarization process, such as a chemical mechanical polish (CMP), an etch-back process, combinations thereof, or the like. As illustrated in FIG. 6, following the planarization process, the top surface of the first epitaxial layer 106 is substantially level with the top surface of the second epitaxial layer 114. In some embodiments, following the planarization process, the second epitaxial layer 114 may have a thickness of between about 1 Å and about 299 Å, and the first epitaxial layer 106 in the second region R2 may have a thickness of between about 1 Å and about 300 Å.

Figure 7:
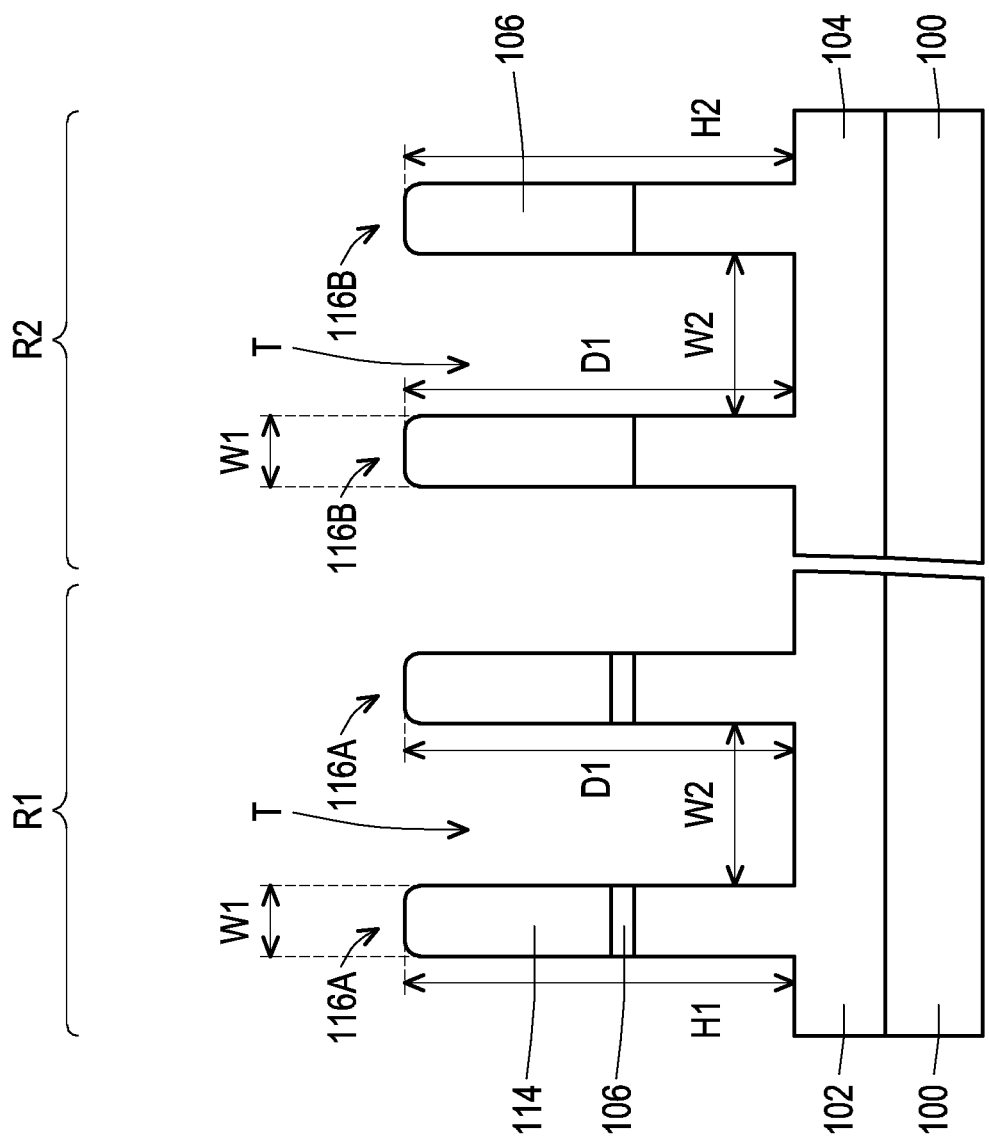

Referring to FIG. 7, the second epitaxial layer 114, the first epitaxial layer 106, the n-well region 102, and the p-well region 104 are etched to form first semiconductor fins 116A in the first region R1 and second semiconductor fins 116B in the second region R2. In some embodiments, the first semiconductor fins 116A and the second semiconductor fins 116B may be formed by etching trenches T in the second epitaxial layer 114, the first epitaxial layer 106, the n-well region 102, and the p-well region 104. The etching may be one or more of any acceptable etch process, such as a reactive ion etch (RIE), a neutral beam etch (NBE), the like, or a combination thereof. The etching may be anisotropic.

The first semiconductor fins 116A and the second semiconductor fins 116B may be formed by any suitable method. For example, the first semiconductor fins 116A and the second semiconductor fins 116B may be formed by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Although a double-patterning or multi-patterning process is not separately illustrated, in one embodiment, the double-patterning or multi-patterning process may include forming a sacrificial layer over a substrate. The sacrificial layer is patterned using a photolithography process. Spacers are formed alongside the sacrificial layer using a self-aligned process. The sacrificial layer is then removed and the remaining spacers are used to pattern first semiconductor fins 116A and second semiconductor fins 116B.

As illustrated in FIG. 7, the first semiconductor fins 116A protrude from the substrate 100 to separate two adjacent trenches T, and the second semiconductor fins 116B protrude from the substrate 100 to separate two adjacent trenches T. In some embodiments, the width W1 of each of the first semiconductor fins 116A and the second semiconductor fins 116B ranges from about 5 nm to about 10 nm. In some embodiments, the height H1 of each of the first semiconductor fins 116A and the second semiconductor fins 116B ranges from about 30 nm to about 100 nm, and the depth D1 of each of the trenches T ranges from about 30 nm to about 100 nm. In some embodiments, the width W2 of each of the trenches T between two adjacent first semiconductor fins 116A and between two adjacent second semiconductor fins 116B ranges from about 10 nm to about 30 nm. Although the first semiconductor fins 116A and the second semiconductor fins 116B are illustrated as having rounded corners and linear edges in FIG. 7, the first semiconductor fins 116A and the second semiconductor fins 116B may have any other suitable shape, such as having tapered sidewalls.

Including the second epitaxial layer 114 formed of, e.g., silicon germanium in the first semiconductor fins 116A in the first region R1 (e.g., the PMOS region) may increase the hole mobility of subsequently formed PMOS transistors. Additionally, because germanium has a smaller bandgap than silicon, including the second epitaxial layer 114 in the first semiconductor fins 116A may yield a higher current in subsequently formed PMOS transistors.

Figure 8:
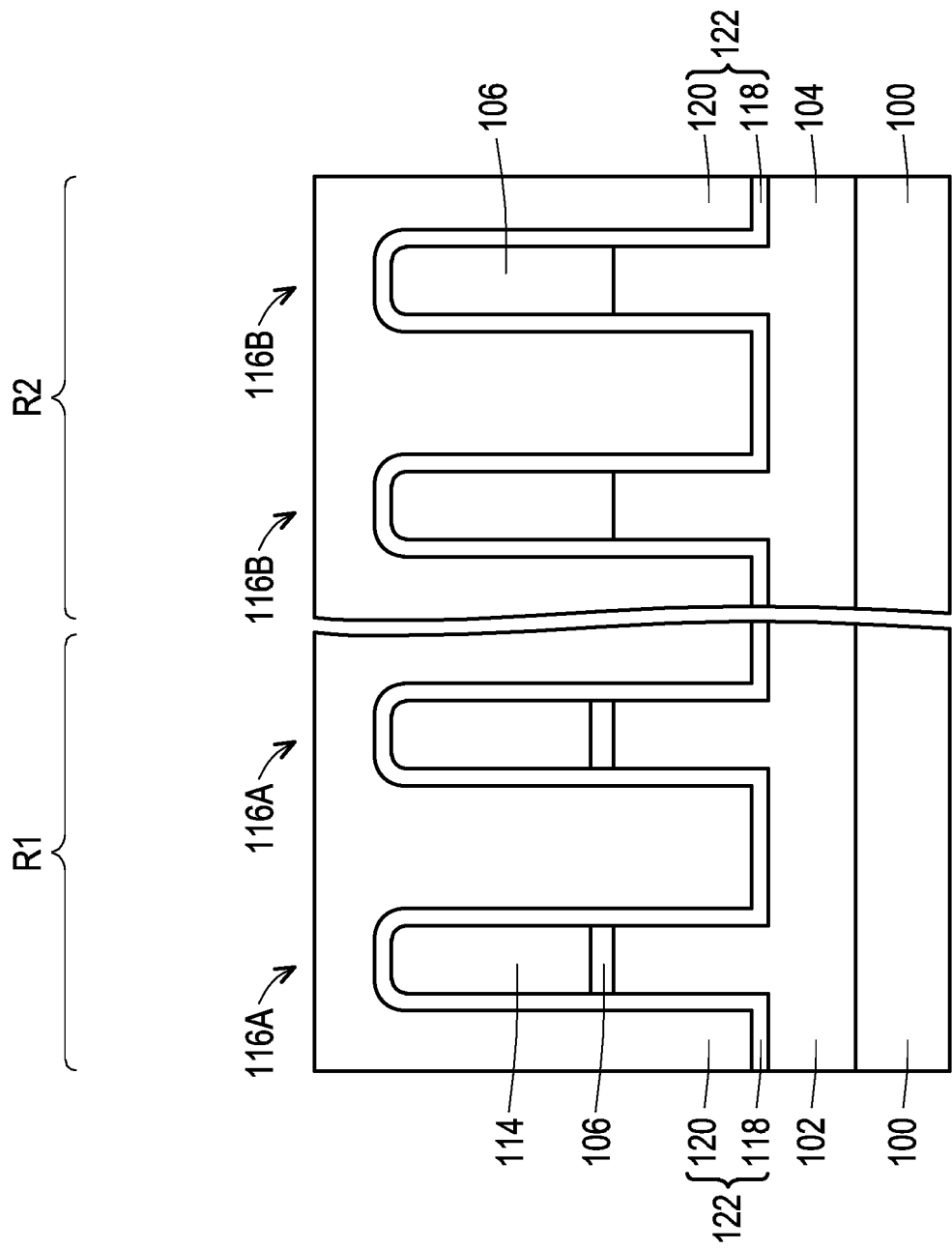

Referring to FIG. 7 and FIG. 8, an insulation material 122 is formed over the substrate 100, the first semiconductor fins 116A and the second semiconductor fins 116B, and filling the trenches T. In some embodiments, the insulation material 122 includes a liner 118 and a dielectric material 120 over the liner 118, as illustrated in FIG. 8. The liner 118 may be formed as a conformal layer, whose horizontal portions and vertical portions have thicknesses close to each other.

In some embodiments, the liner 118 is formed by oxidizing exposed surfaces of the substrate 100, the first semiconductor fins 116A, and the second semiconductor fins 116B in an oxygen-containing environment, for example, through Local Oxidation of Silicon (LOCOS), wherein oxygen ($O_2$) may be included in the respective process gas. In other embodiments, the liner 118 is formed using, for example, In-Situ Steam Generation (ISSG) with water steam or a combined gas of hydrogen ($H_2$) and oxygen ($O_2$) used to oxidize the exposed surfaces of the substrate 100, the first semiconductor fins 116A, and the second semiconductor fins 116B. The ISSG oxidation may be performed at an elevated temperature. In yet other embodiments, the liner 118 is formed using a deposition technique, such as ALD, CVD, sub-atmospheric chemical vapor deposition (SACVD), the like, or a combination thereof. In some embodiments, the liner 118 may have a thickness of between about 0.2 Å and about 100 Å. Although the liner 118 is described and illustrated as being a layer formed on the exposed surfaces of the substrate 100, the first semiconductor fins 116A, and the second semiconductor fins 116B in FIG. 1, the disclosure is not limited thereto. In some alternative embodiments, portions of the substrate 100, the first semiconductor fins 116A, and the second semiconductor fins 116B near to the exposed surfaces thereof are converted into liner 118.

The dielectric material 120 is formed to fill remaining portions of the trenches T over the substrate 100. As shown in FIG. 8, the dielectric material 120 may overfill the trenches T over the substrate 100, such that a portion of the dielectric material 120 extends above the top surfaces of the first semiconductor fins 116A and the second semiconductor fins 116B. In such embodiments, the dielectric material 120 fills up the trenches T and covers the first semiconductor fins 116A, the second semiconductor fins 116B and the liner 118. In some embodiments, the dielectric material 120 may comprise silicon oxide, silicon carbide, silicon nitride, silicon oxynitride, the like, or a combination thereof, and may be formed using flowable chemical vapor deposition (FCVD), spin-on coating, CVD, ALD, high-density plasma chemical vapor deposition (HDPCVD), low pressure chemical vapor deposition (LPCVD), the like, or a combination thereof. After the dielectric material 120 is deposited, an anneal/curing step may be performed, which may convert the flowable dielectric material 120 into a solid dielectric material. In some embodiments, an interface between the liner 118 and the dielectric material 120 may be distinguishable due to different material properties such as different types of materials and/or different densities.

Figure 9:
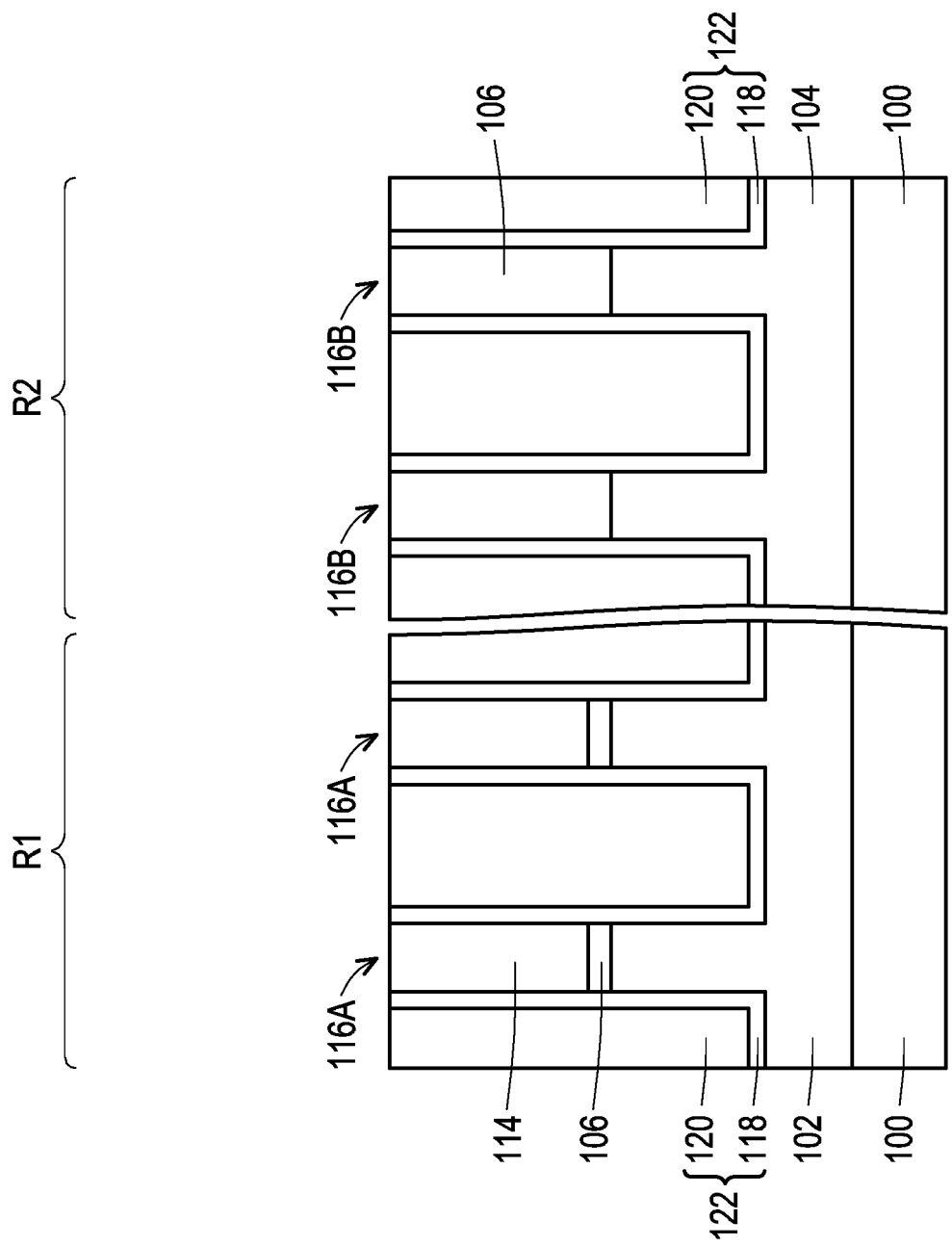

Referring to FIG. 9, a planarization process is applied to the insulation material 122. In some embodiments, the planarization process includes a chemical mechanical polish (CMP), an etch-back process, combinations thereof, or the like. As illustrated in FIG. 9, the planarization process may expose the top surfaces of the first semiconductor fins 116A and the second semiconductor fins 116B. Portions of the first semiconductor fins 116A and the second semiconductor fins 116B may also be planarized by the planarization process. The top surfaces of the first semiconductor fins 116A, the second semiconductor fins 116B, and the insulation material 122 are substantially level or coplanar after the planarization process is complete.

Figure 10:
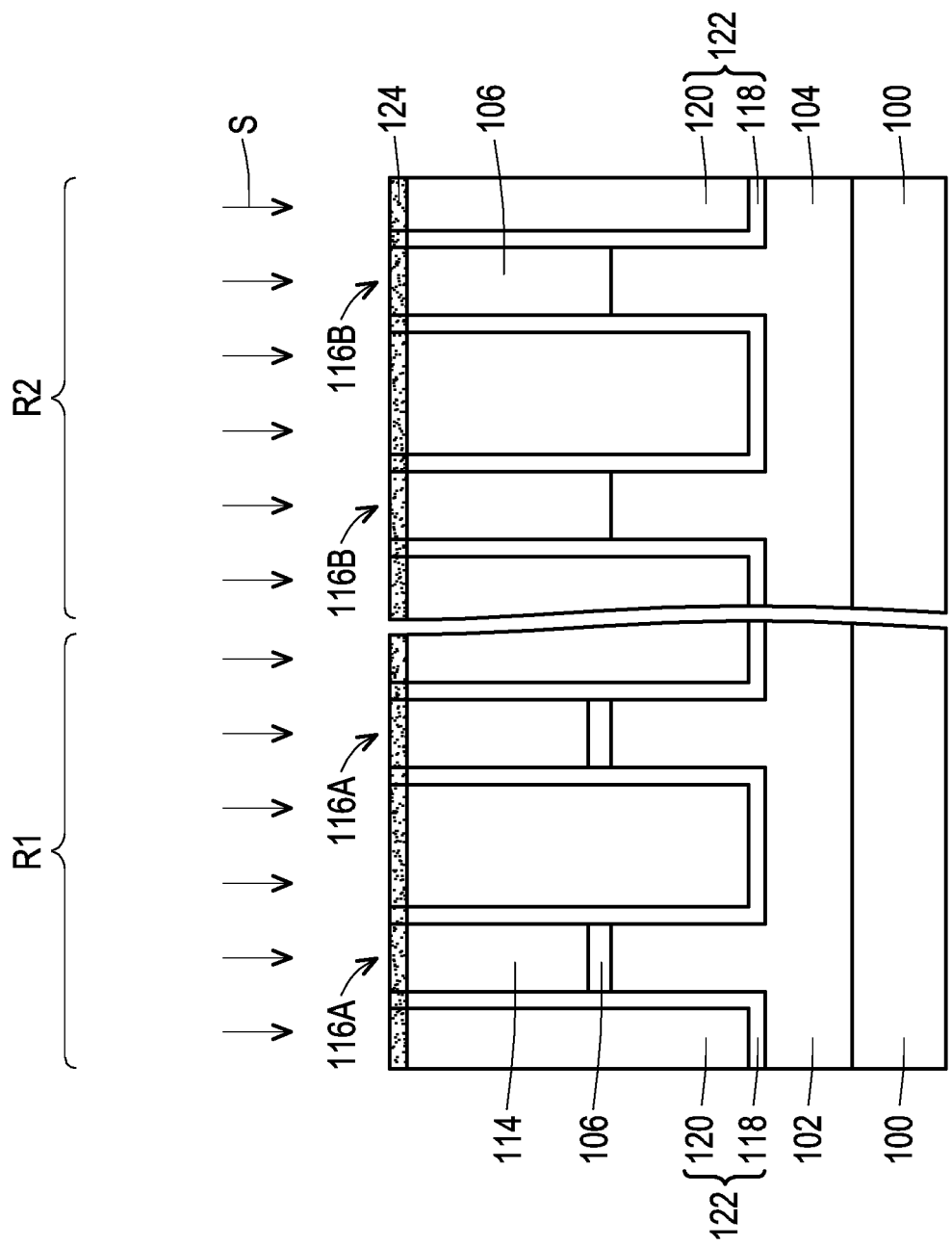

Referring to FIG. 10, an implantation process S is performed over the substrate 100. As shown in FIG. 10, the implantation process S is a blanket ion implantation process, so that an implantation species is implanted into the first semiconductor fins 116A, the second semiconductor fins 116B, and the insulation material 122. As a result, an implant region 124 is formed in the first semiconductor fins 116A, the second semiconductor fins 116B, and the insulation material 122 near to the top surfaces of the first semiconductor fins 116A, the second semiconductor fins 116B, and the insulation material 122. In detail, as shown in FIG. 10, the implant region 124 is formed in the second epitaxial layer 114 of each first semiconductor fin 116A, and in the first epitaxial layer 106 of each second semiconductor fin 116B.

In some embodiments, the implantation species includes silicon (Si). In such case, upon the implantation process S, the implant region 124 has a silicon concentration greater than the rest portions of the first semiconductor fins 116A, the second semiconductor fins 116B and the insulation material 122 which are not implanted by the implantation species during the implantation process S. As such, in some embodiments, the implant region 124 is referred to as a silicon-rich region. In some embodiments, since silicon content of the implant region 124 in the second epitaxial layer 114 comprising SiGe is greater than that of the rest portion of the second epitaxial layer 114 comprising SiGe, the difference between the germanium content of the rest portion of the second epitaxial layer 114 comprising SiGe and the germanium content of the implant region 124 in the second epitaxial layer 114 comprising SiGe is about 1%. As the germanium content of the implant region 124 in the second epitaxial layer 114 is in such range, the implant region 124 in the second epitaxial layer 114 has the sufficient etching selectivity as the implant region 124 in the first epitaxial layer 106 with respect to the insulation material 122, such that the implant region 124 in the second epitaxial layer 114 could remain substantially intact during removal of the insulation material 122 in the subsequent step as to be described with reference to FIG. 11A. From another point of view, with silicon as implantation species, the manufacturing process of the FinFETs in accordance with some embodiments can be compatible with the currently-adopted manufacturing process, since no new material is brought into the manufacturing process.

The implantation energy and the implantation dose are appropriately chosen to create the implant region 124 inside of the first semiconductor fins 116A, the second semiconductor fins 116B, and the insulation material 122 with the desired depth. In some embodiments, the implant region 124 has a depth range of about 0.5 nm to about 2 nm from the top surfaces of the first semiconductor fins 116A, the second semiconductor fins 116B, and the insulation material 122. In some embodiments, the implantation dose ranges from about E13 atom/cm² to about E15 atom/cm². Such energy range and dose range are chosen so the implant region 124 is created with desired depth and desired germanium content without nearly damage on the top surfaces of the first semiconductor fins 116A, the second semiconductor fins 116B, and the insulation material 122.

Figure 11A:
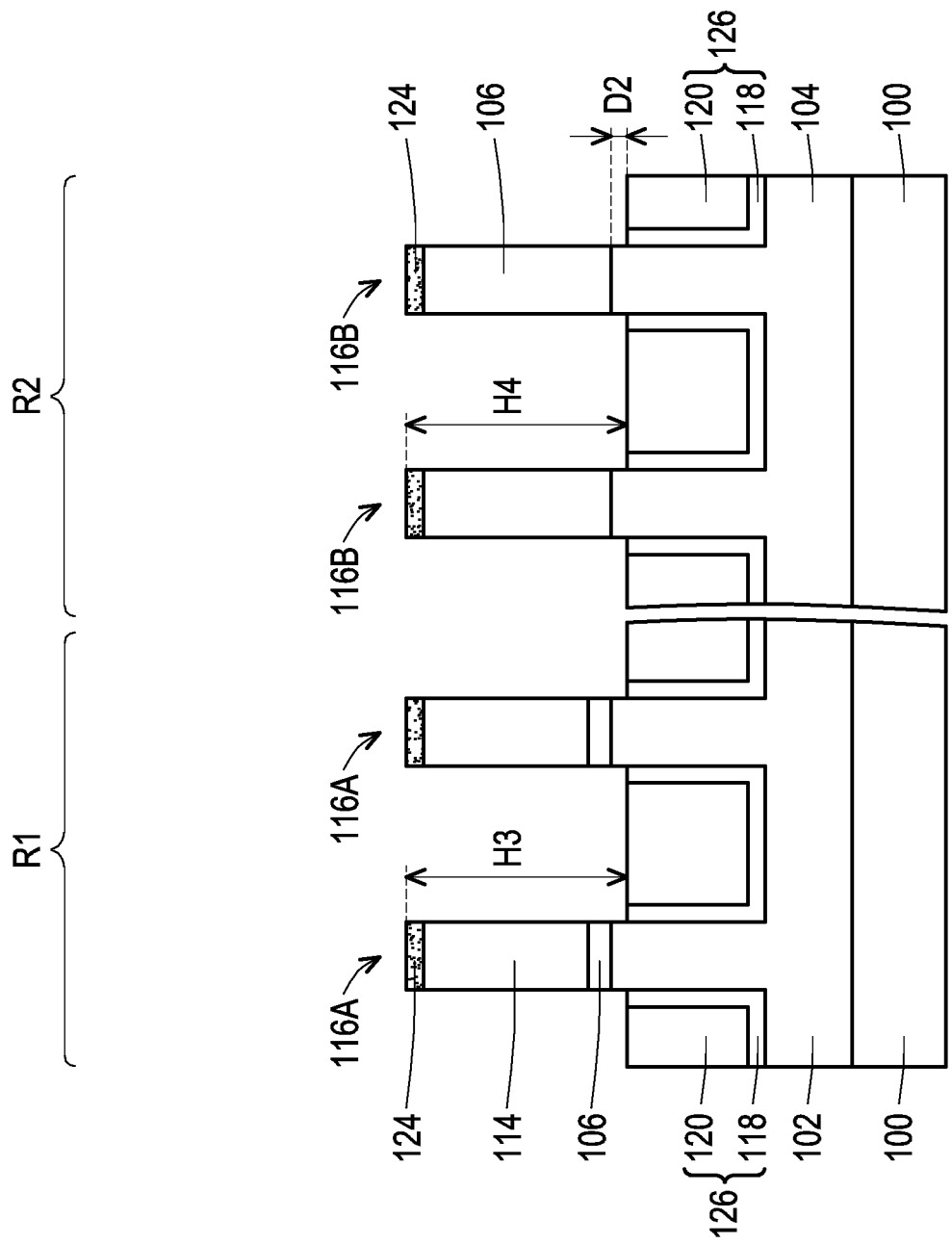
Figure 11B:
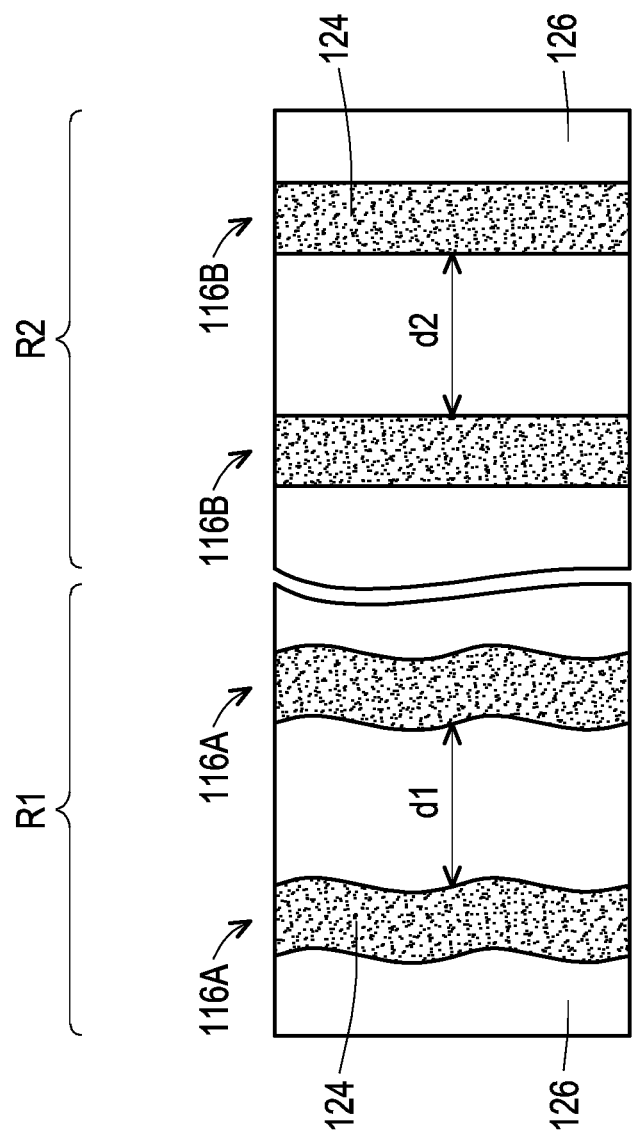
FIG. 11B is a top view illustrating a stage of a method of manufacturing the FinFETs in FIG. 11A.

Referring to FIG. 11A, the insulation material 122 is recessed to form shallow trench isolation (STI) regions 126. The insulation material 122 is recessed such that the first semiconductor fins 116A in the first region R1 and the second semiconductor fins 116B in the second region R2 protrude from between neighboring STI regions 126. In detail, as illustrated in FIG. 11A, the insulation material 122 may be recessed such that the first epitaxial layer 106 with the implant region 124 in the second region R2, the second epitaxial layer 114 with the implant region 124 in the first region R1, the first epitaxial layer 106 in the first region R1, and at least portions of the n-well region 102 and the p-well region 104 protrude from the STI regions 126. In some embodiments, the n-well region 102 and the p-well region 104 may protrude from the STI regions 126 by a distance D2 of between about 1 Å and about 100 Å. The exposed portions of the first semiconductor fins 116A and the second semiconductor fins 116B may respectively have a height H3 measured from the top surface of the STI regions 126 to the top surfaces of the first semiconductor fins 116A and a height H4 measured from the top surface of the STI regions 126 to the top surfaces of the second semiconductor fins 116B. In some embodiments, each of the height H3 and the height H4 ranges from about 30 nm to about 100 nm. The STI regions 126 may be formed by using an acceptable etching process, such as one that is selective to the material of the insulation material 122. For example, a chemical oxide removal using a plasma-less gaseous etching process (e.g., an etching process using hydrogen fluoride (HF) gas, ammonia (NH₃) gas, or the like), a remote plasma assisted dry etch process (e.g., a process using hydrogen (H₂), nitrogen trifluoride (NF₃), and ammonia by-products, or the like), or dilute hydrofluoric (dHF) acid may be used.

In general, the epitaxial layer comprising Si of the semiconductor fins (e.g., second semiconductor fins 116B) has a sufficient etching selectivity with respect to the STI regions, while the epitaxial layer comprising SiGe of the semiconductor fins (e.g., first semiconductor fins 116A) has an insufficient etching selectivity with respect to the STI regions. As such, after the STI regions are formed, there is a great height difference between the semiconductor fins comprising the epitaxial layer of Si and the semiconductor fins comprising the epitaxial layer of SiGe, so as to affect the performance of the resulting device.

In view of this, by performing the implantation process S to form the silicon-rich region (i.e., the implant region 124) in the second epitaxial layer 114 comprising SiGe of the first semiconductor fins 116A and in the first epitaxial layer 106 comprising Si of the second semiconductor fins 116B, the first semiconductor fins 116A can have the sufficient etching selectivity with respect to the insulation material 122 as that of the second semiconductor fins 116B. Accordingly, the height difference between the first semiconductor fins 116A and the second semiconductor fins 116B can be reduced during the formation of the STI regions 126.

As shown in FIG. 11A, after the STI regions 126 are formed, the top surface of the first semiconductor fins 116A is substantially coplanar or flush with the top surface of the second semiconductor fins 116B. That is to say, the top surface of the implant region 124 in the first semiconductor fins 116A is substantially coplanar or flush with the top surface of the implant region 124 in the second semiconductor fins 116B. In other word, there is no height difference between the first semiconductor fins 116A and the second semiconductor fins 116B (i.e., the height H3 of the exposed portions of the first semiconductor fins 116A is substantially equal to the height H4 of the exposed portions of the second semiconductor fins 116B) after the insulation material 122 is recessed. However, the disclosure is not limited thereto. In some alternative embodiments, there is a slight height difference (to a neglectable degree for the resulting FinFETs) between the first semiconductor fins 116A and the second semiconductor fins 116B after the insulation material 122 is recessed. In some embodiments, the slight height difference is greater than 0 to about 3 nm. As such, by forming the implant region 124, the FinFETs including the first semiconductor fins 116A and the second semiconductor fins 116B can have improved device performance.

Further, as shown in FIG. 11A, the implant region 124 in the first semiconductor fins 116A and the second semiconductor fins 116B could remain substantially intact after the STI regions 126 are formed. However, the disclosure is not limited thereto. In some alternative embodiments, during the formation of the STI regions 126, the implant region 124 may be still in the first semiconductor fins 116A and the second semiconductor fins 116B with slightly removed.

Moreover, in general, during the formation of the STI regions, the semiconductor fins comprising the material with low Young's modulus (e.g., SiGe) are easily to bend or warp (referred to as a wiggle effect) and have the increased line edge roughness, such that the performance of the resulting device is reduced.

Performing the implantation process S to form the silicon-rich region (i.e., the implant region 124) in the first semiconductor fins 116A enhances the Young's modulus of the first semiconductor fins 116A comprising SiGe. Because the Young's modulus of the first semiconductor fins 116A is enhanced, the wiggle effect in the first semiconductor fins 116A is reduced (e.g., less bending, warping or wiggle curves along the length of the first semiconductor fins 116A), and the first semiconductor fins 116A have improved line edge roughness (LER) (e.g., reduced LER). In some embodiments, the Young's modulus of the implant region 124 in the second epitaxial layer 114 is higher than the Young's modulus of the rest portion of the second epitaxial layer 114, and the Young's modulus of the first epitaxial layer 106 is higher than the Young's modulus of the rest portion of the second epitaxial layer 114. In some embodiments, the Young's modulus of the implant region 124 in the second epitaxial layer 114 ranges between about 135 GPa and about 150 GPa. In some embodiments, the ratio of the Young's modulus of the implant region 124 in the second epitaxial layer 114 to the Young's modulus of the rest portion of the second epitaxial layer 114 is about 1%.

As shown in a schematic top view of FIG. 11B, after the formation of the STI regions 126, the first semiconductor fins 116A have wiggle effect, while the sidewalls of the second semiconductor fins 116B remain straight (i.e., without bending or warping). That is to say, after the formation of the STI regions 126, the space d1 between two adjacent first semiconductor fins 116A would vary (i.e., be non-uniform and not consistent), while the space d2 between two adjacent second semiconductor fins 116B is substantially uniform and consistent. In some embodiments, by forming the implant region 124, the LER of the first semiconductor fins 116A after the formation of the STI regions 126 can be improved by about 10%. In some embodiments, by forming the implant region 124, the space variation of the space d1 between two adjacent first semiconductor fins 116A after the formation of the STI regions 126 can be improved by about 15%.

As discussed above, forming the implant region 124 according to the processes described above reduces the fin height loss, the wiggle effect and the LER of the first semiconductor fins 116A comprising SiGe. As such, semiconductor devices (e.g., FinFETs) including the first semiconductor fins 116A and the second semiconductor fins 116B have improved performance.

Figure 12A:
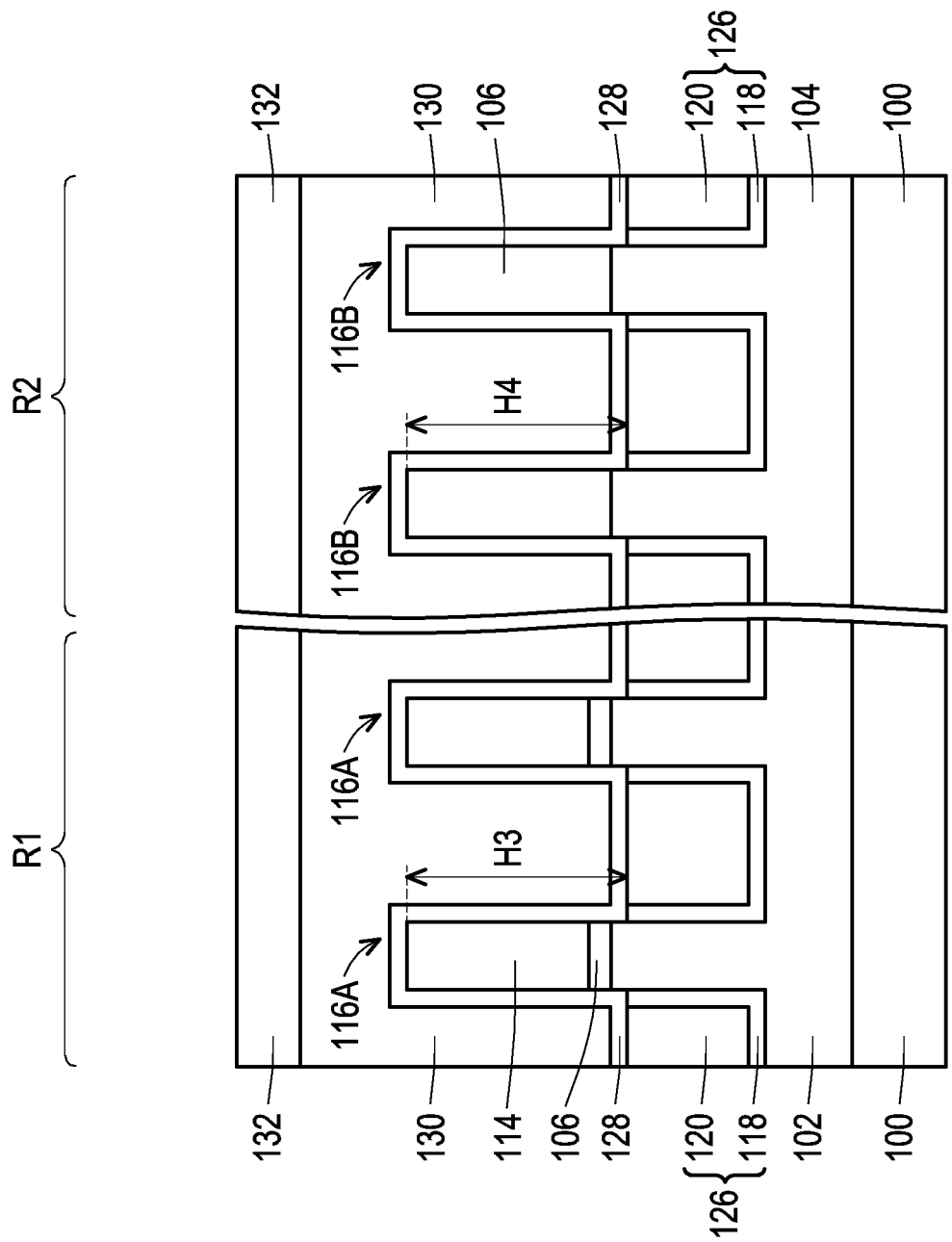
Figure 12B:
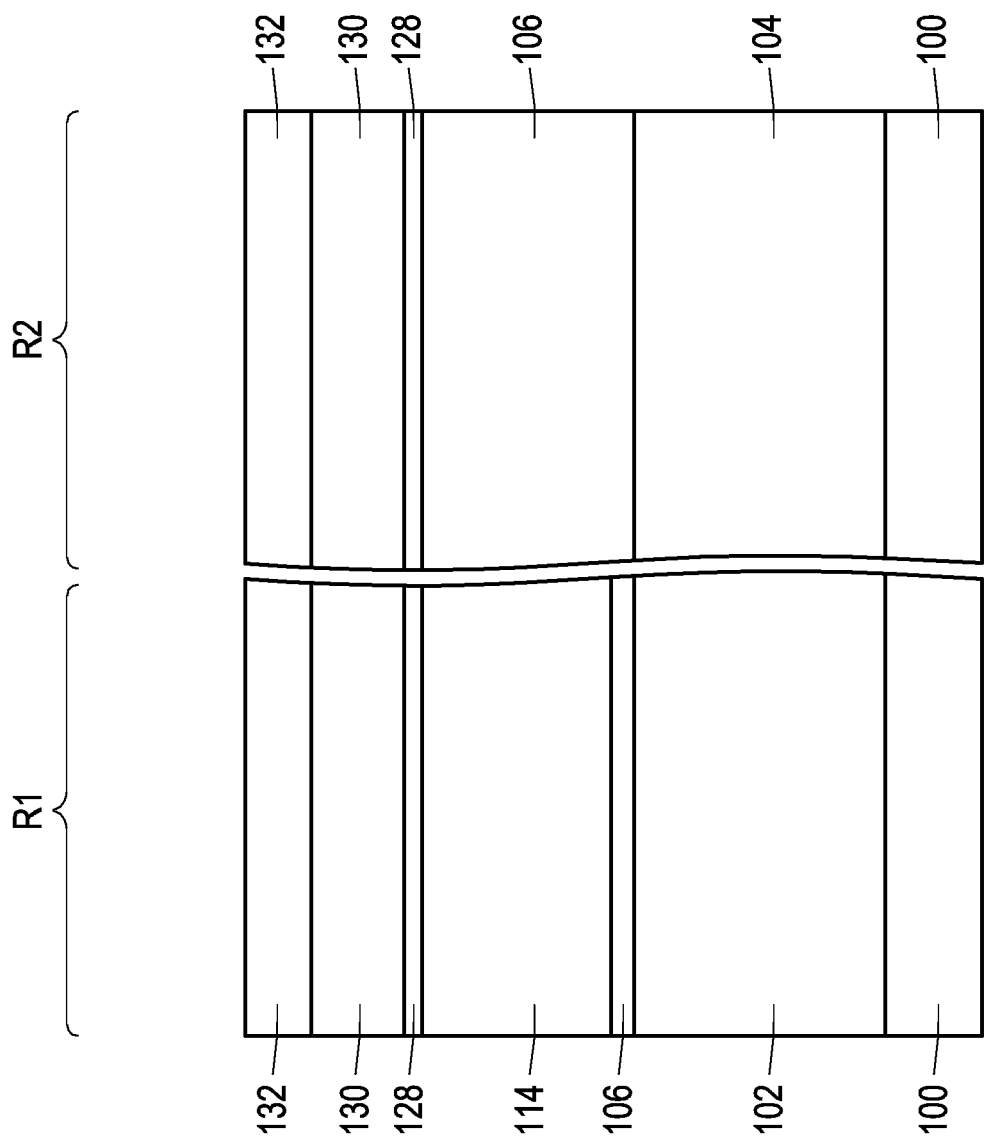

In FIG. 12A and FIG. 12B, a dummy dielectric layer 128 is formed over the STI regions 126. The dummy dielectric layer 128 may be formed as a conformal layer, whose horizontal portions and vertical portions have thicknesses close to each other. In some embodiments, the dummy dielectric layer 128 may have a thickness of between about 0.5 nm and about 3 nm. In detail, referring to FIG. 11A and FIG. 12A, the implant region 124 is converted into the dummy dielectric layer 128. That is to say, the portions with the changed composition of the first semiconductor fins 116A and the second semiconductor fins 116B are converted into the dummy dielectric layer 128. On other words, after the dummy dielectric layer 128 is formed, the height H3 of the first semiconductor fins 116A and the height H4 of the second semiconductor fins 116B are reduced. It is noted that the electrical properties (e.g., carrier mobility) of the implant region 124 in the first semiconductor fins 116A and the second semiconductor fins 116B are altered due to the changed composition thereof by implanting the implantation species, and thus converting the implant region 124 into the dummy dielectric layer 128 prevents the performance of the resulting FinFETs from affecting. Although the dummy dielectric layer 128 is described and illustrated as being a layer formed on the exposed sidewalls of the first semiconductor fins 116A and the second semiconductor fins 116B in FIG. 12A, the disclosure is not limited thereto. In some alternative embodiments, portions of the first semiconductor fins 116A and the second semiconductor fins 116B near to the exposed sidewalls thereof are converted into dummy dielectric layer 128. From another point of view, the dummy dielectric layer 128 is formed in directly contact with the first semiconductor fins 116A, the second semiconductor fins 116B and the STI regions 126.

In some embodiments, the dummy dielectric layer 128 is formed by performing nitridation process, oxidation process, or the combination thereof. For example, the dummy dielectric layer 128 is formed by oxidizing exposed surfaces of the STI regions 126, the first semiconductor fins 116A, and the second semiconductor fins 116B in an oxygen-containing environment through Local Oxidation of Silicon (LOCOS), wherein oxygen ($O_2$) may be included in the respective process gas. In other embodiments, the dummy dielectric layer 128 is formed using, for example, In-Situ Steam Generation (ISSG) with water steam or a combined gas of hydrogen ($H_2$) and oxygen ($O_2$) used to oxidize the exposed surfaces of the STI regions 126, the first semiconductor fins 116A, and the second semiconductor fins 116B. The ISSG oxidation may be performed at an elevated temperature. In yet other embodiments, the dummy dielectric layer 128 is formed using a deposition technique, such as ALD, CVD, sub-atmospheric chemical vapor deposition (SACVD), the like, or a combination thereof. The dummy dielectric layer 128 may include, for example, silicon oxide, silicon nitride, germanium oxide, germanium nitride, a combination thereof, or the like.

Apparently, after the implant region 124 has achieve its function (i.e., reducing the fin height loss, the wiggle effect and the LER of the first semiconductor fins 116A comprising SiGe during the formation of the STI regions 126), the implant region 124 can be eliminated by the currently-adopted manufacturing process (i.e., the formation process of the dummy dielectric layer 128) without affecting the performance of the resulting FinFETs. As such, the manufacturing process of the FinFETs in accordance with some embodiments can be compatible with the currently-adopted manufacturing process.

A dummy gate layer 130 is formed over the dummy dielectric layer 128, and a mask layer 132 is formed over the dummy gate layer 130. The dummy gate layer 130 may be deposited over the dummy dielectric layer 128 and then planarized, such as by a CMP. The mask layer 132 may be deposited over the dummy gate layer 130. The dummy gate layer 130 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 130 may be deposited by physical vapor deposition (PVD), CVD, sputter deposition, or other techniques known and used in the art for depositing conductive materials. The dummy gate layer 130 may be made of other materials that have a high etching selectivity from the etching of isolation regions. The mask layer 132 may include, for example, SiN, SiON, or the like. Although a single dummy gate layer 130 and a single mask layer 132 are described and illustrated to form across the regions in which the first semiconductor fins 116A and the second semiconductor fins 116B are formed, as shown in FIG. 12A and FIG. 12B, the disclosure is not limited thereto. In some alternative embodiments, separate dummy gate layers 130 and separate mask layers 132 may be formed in the region in which the first semiconductor fins 116A are formed and the region in which the second semiconductor fins 116B are formed.

Figure 13A:
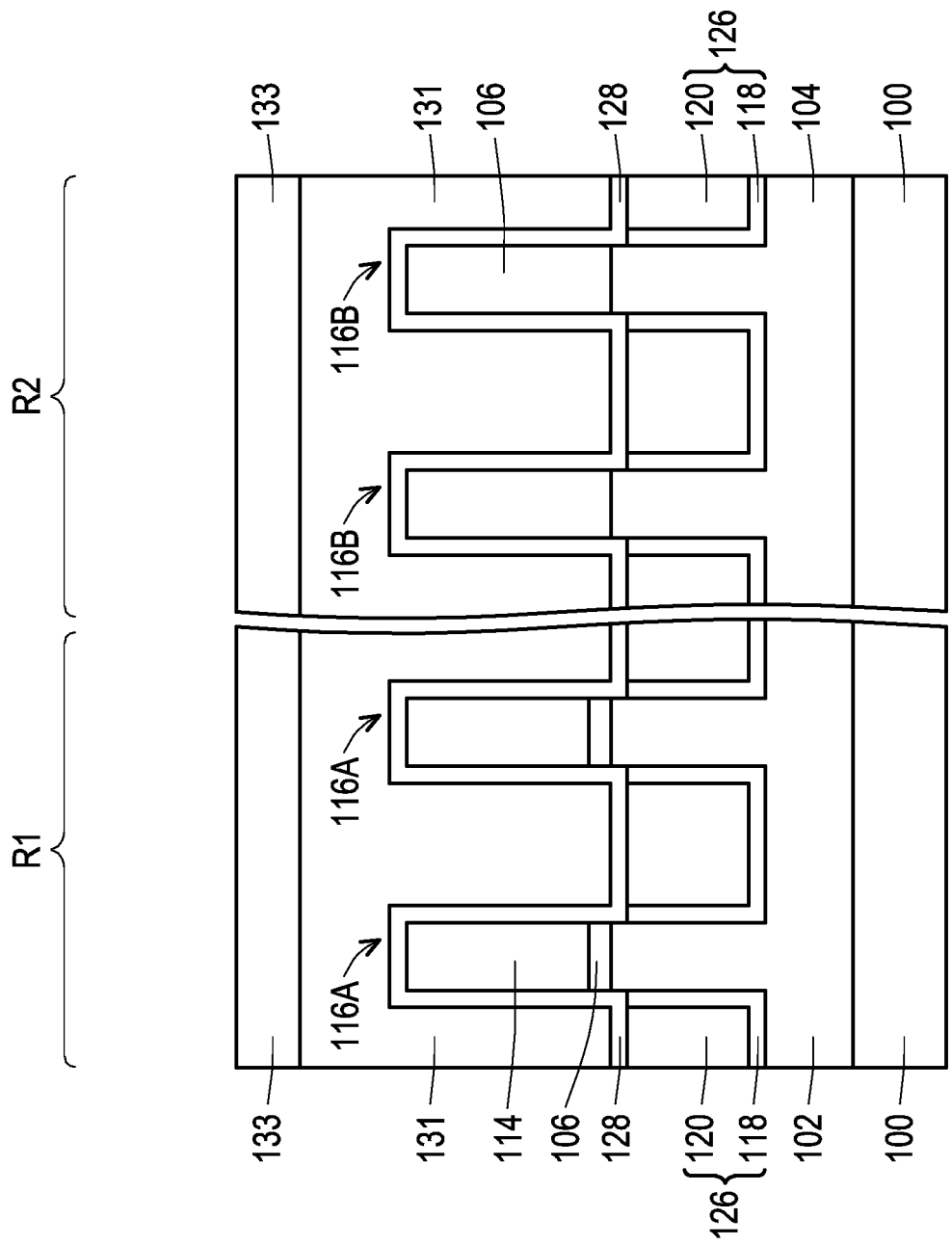
Figure 13B:
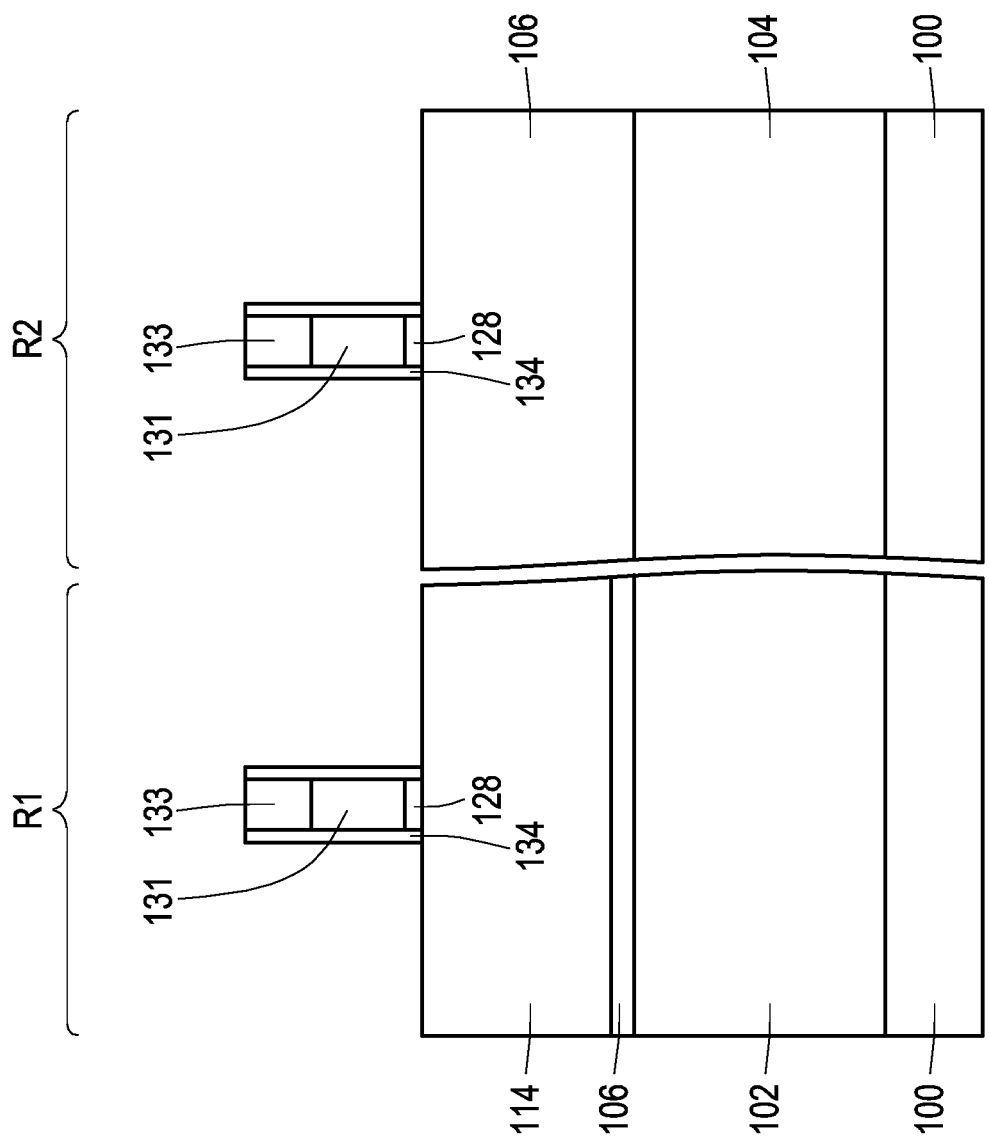

Referring to FIG. 13A and FIG. 13B, the mask layer 132 may be patterned using acceptable photolithography and etching techniques to form masks 133. The pattern of the masks 133 may be transferred to the dummy gate layer 130 by an acceptable etching technique to form dummy gates 131. In some embodiments, the pattern of the masks 133 may also be transferred to the dummy dielectric layer 128. In some embodiments, the dummy gate 131 and the corresponding dummy dielectric layer 128 may be collectively referred to as a "dummy gate" or a "dummy gate stack." The dummy gates 131 cover respective channel regions of the first semiconductor fins 116A and the second semiconductor fins 116B. The pattern of the masks 133 may be used to physically separate each of the dummy gates 131 from adjacent dummy gates 131. The dummy gates 131 may also have a lengthwise direction substantially perpendicular to the lengthwise direction of the first semiconductor fins 116A and the second semiconductor fins 116B.

As further illustrated in FIG. 13B, gate seal spacers 134 may be formed on exposed sidewalls of the dummy gates 131, the dummy dielectric layer 128, the masks 133, and/or the first semiconductor fins 116A and the second semiconductor fins 116B. A thermal oxidation or a deposition followed by an anisotropic etch may be used to form the gate seal spacers 134. Although only one gate seal spacer 134 is illustrated in FIG. 13B, the gate seal spacers 134 may comprise a plurality of layers.

After the formation of the gate seal spacers 134, implants for lightly doped source/drain (LDD) regions (not explicitly illustrated) may be performed. In the embodiments with different device types, a mask, such as a photoresist, may be formed over the first region R1, while exposing the second region R2, and appropriate type (e.g., n-type) impurities may be implanted into the exposed second semiconductor fins 116B in the second region R2. The mask may then be removed. Subsequently, a mask, such as a photoresist, may be formed over the second region R2 while exposing the first region R1, and appropriate type (e.g., p-type) impurities may be implanted into the exposed first semiconductor fins 116A in the first region R1. The mask may then be removed. The n-type impurities may be phosphorus, arsenic, or the like, and the p-type impurities may be boron, $BF_2$, or the like. The lightly doped source/drain regions may have a concentration of impurities of from about $1015$ $cm^{-3}$ to about $1016$ $cm^{-3}$. An anneal may be used to activate the implanted impurities.

Figure 14A:
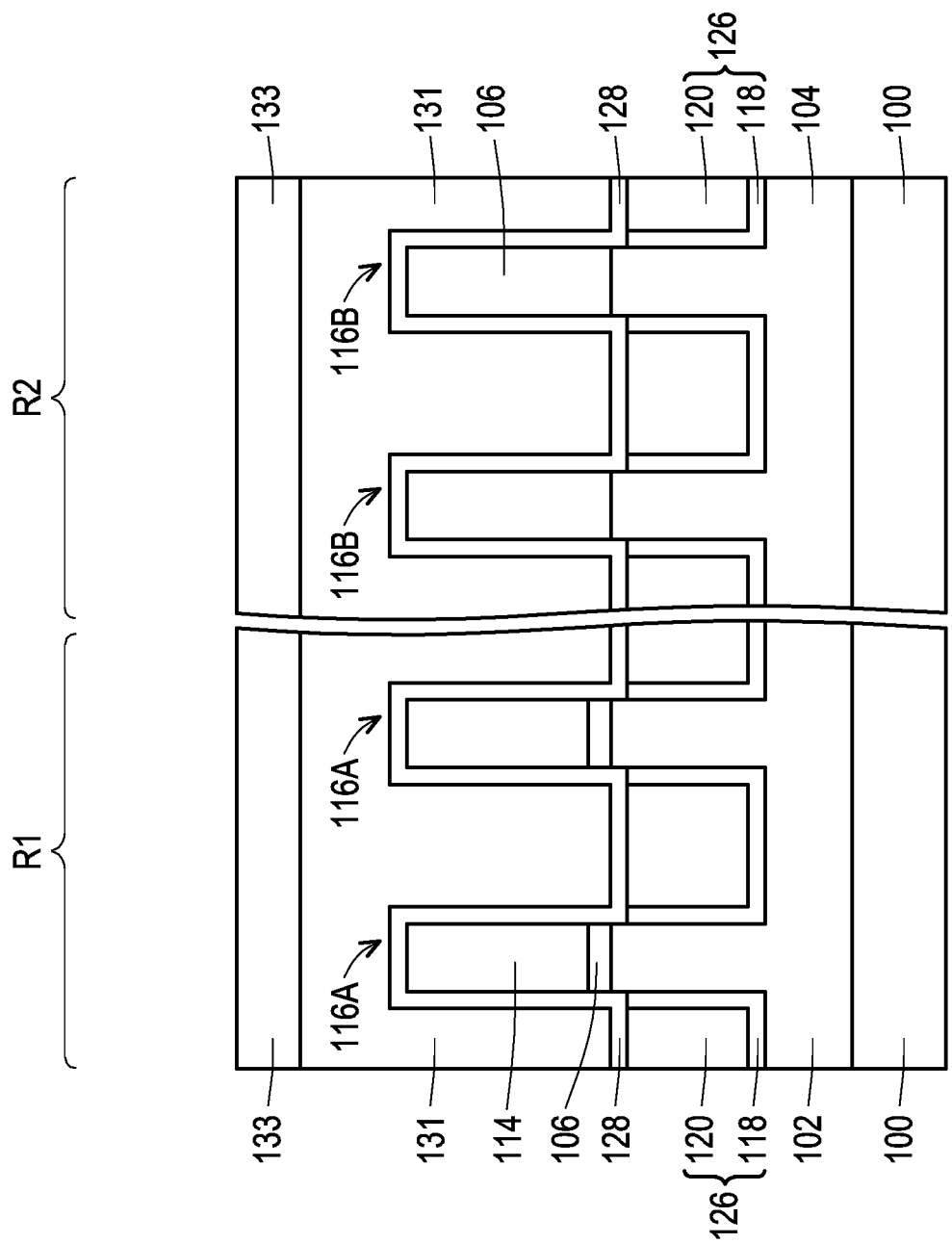
Figure 14B:
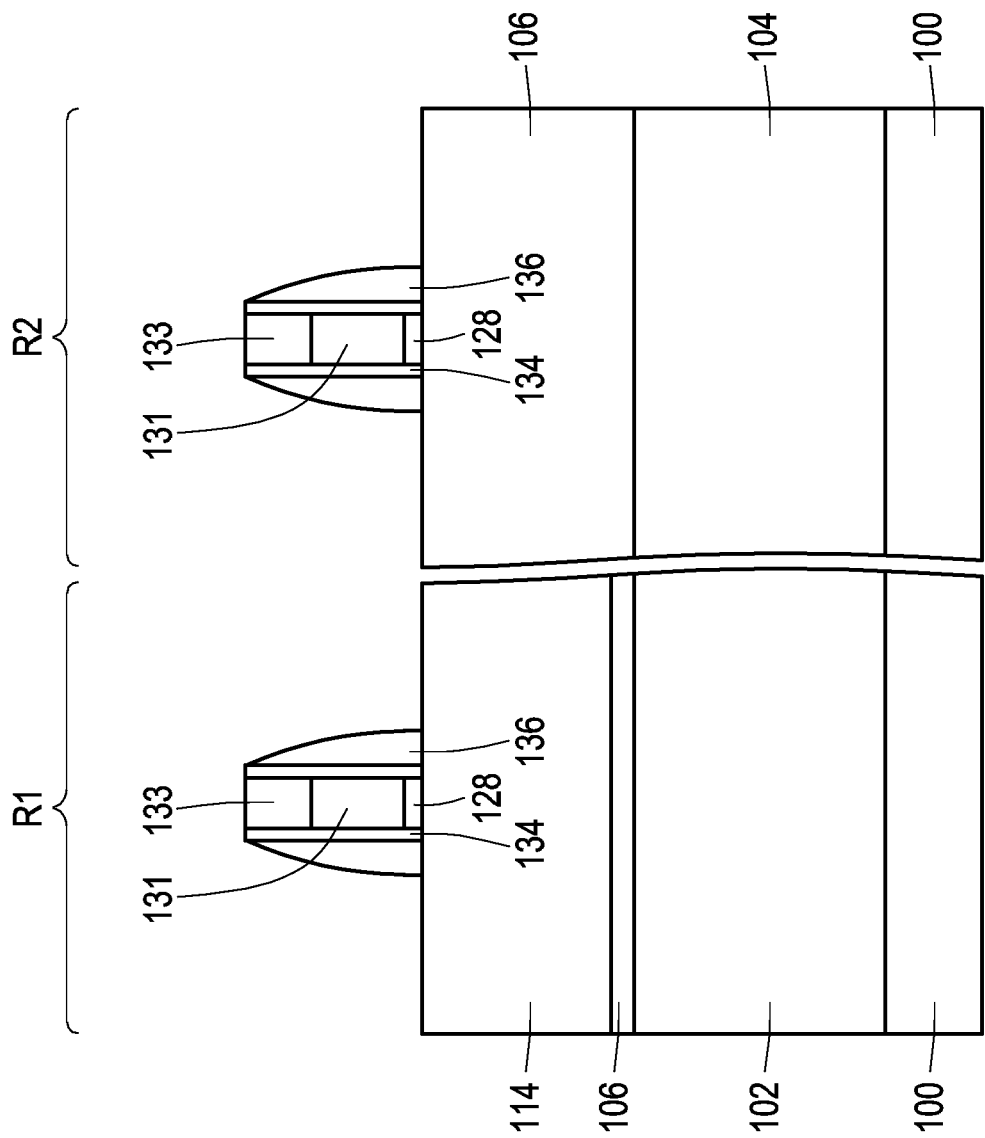

Referring to FIG. 14A and FIG. 14B, gate spacers 136 are formed on the gate seal spacers 134 along sidewalls of the dummy gates 131 and the masks 133. The gate spacers 136 may be formed by conformally depositing a material and subsequently anisotropically etching the material. The material of the gate spacers 136 may be silicon nitride, SiCN, a combination thereof, or the like. The gate spacers 136 may comprise a single layer or multiple layers.

Referring to FIGS. 15A-15D, epitaxial source/drain regions 138 are formed in the first semiconductor fins 116A and the second semiconductor fins 116B. The epitaxial source/drain regions 138 are formed in the first semiconductor fins 116A and the second semiconductor fins 116B such that each dummy gate 131 is disposed between respective neighboring pairs of the epitaxial source/drain regions 138. In some embodiments, the epitaxial source/drain regions 138 may extend into the first semiconductor fins 116A and the second semiconductor fins 116B. In some embodiments, the gate spacers 136 are used to separate the epitaxial source/drain regions 138 from the dummy gates 131 by an appropriate lateral distance so that the epitaxial source/drain regions 138 do not short out subsequently formed gates of the resulting FinFETs.

The epitaxial source/drain regions 138 in the first region R1 (e.g., the PMOS region) may be formed by masking the second region R2 (e.g., the NMOS region) and etching source/drain regions of the first semiconductor fins 116A in the first region R1 to form recesses in the first semiconductor fins 116A. Then, the epitaxial source/drain regions 138 in the first region R1 are epitaxially grown in the recesses. In some embodiments, the epitaxial source/drain regions 138 may extend through the second epitaxial layer 114 and the first epitaxial layer 106 into the n-well region 102 in the first region R1. The epitaxial source/drain regions 138 may include any acceptable material appropriate for p-type FinFETs. For example, the epitaxial source/drain regions 138 in the first region R1 may include SiGe, SiGeB, Ge, GeSn, or the like. The epitaxial source/drain regions 138 in the first region R1 may be formed of a material having a greater lattice constant than the lattice constant of the second epitaxial layer 114, creating a compressive stress in the channel region to increase hole mobility for PMOS devices. The epitaxial source/drain regions 138 in the first region R1 may have surfaces raised from respective surfaces of the first semiconductor fins 116A and may have facets.

The epitaxial source/drain regions 138 in the second region R2 (e.g., the NMOS region) may be formed by masking the first region R1 (e.g., the PMOS region) and etching source/drain regions of the second semiconductor fins 116B in the second region R2 to form recesses in the second semiconductor fins 116B. Then, the epitaxial source/drain regions 138 in the second region R2 are epitaxially grown in the recesses. The epitaxial source/drain regions 138 may include any acceptable material, such as appropriate for n-type FinFETs. For example, the epitaxial source/drain regions 138 in the second region R2 may include silicon, SiC, SiCP, SiP, or the like. The epitaxial source/drain regions 138 in the second region R2 may be formed of a material having a smaller lattice constant than the lattice constant of the first epitaxial layer 106, creating a tensile stress in the channel region to increase electron mobility for NMOS devices. The epitaxial source/drain regions 138 in the second region R2 may also have surfaces raised from respective surfaces of the second semiconductor fins 116B and may have facets.

The epitaxial source/drain regions 138 and/or the first semiconductor fins 116A and the second semiconductor fins 116B may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 138 may be in situ doped during growth.

As a result of the epitaxy processes used to form the epitaxial source/drain regions 138 in the first region R1 and the second region R2, upper surfaces of the epitaxial source/drain regions 138 have facets which expand laterally outward beyond a sidewalls of the first semiconductor fins 116A and the second semiconductor fins 116B. In some embodiments, these facets cause adjacent source/drain regions 138 to merge as illustrated by FIG. 15C. In other embodiments, adjacent source/drain regions 138 remain separated after the epitaxy process is completed as illustrated by FIG. 15D. The epitaxial source/drain regions 138 formed in the first semiconductor fins 116A or the second semiconductor fins 116B may be merged, as illustrated in FIG. 15C, or separated, as illustrated in FIG. 15D.

Figure 15A:
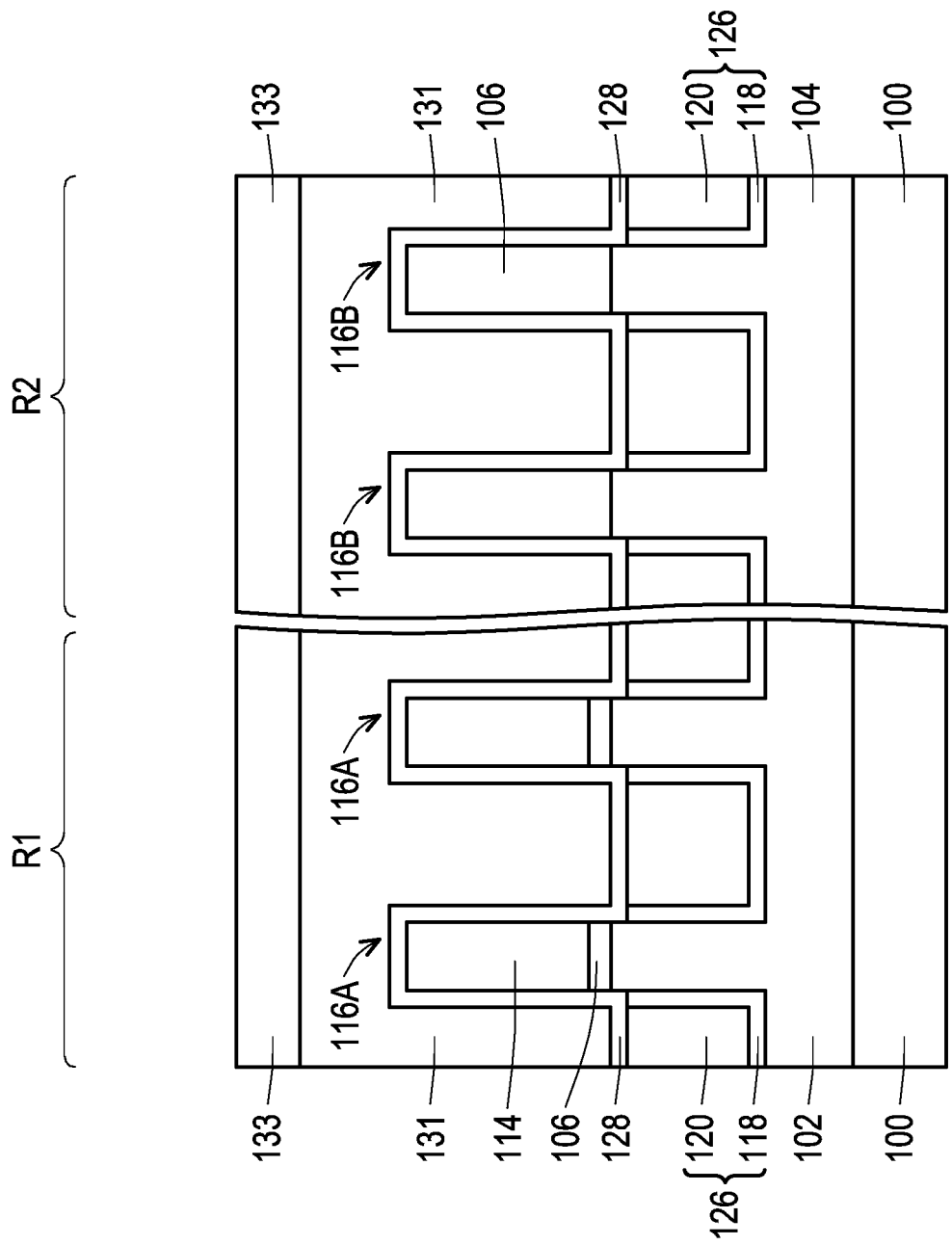
Figure 15B:
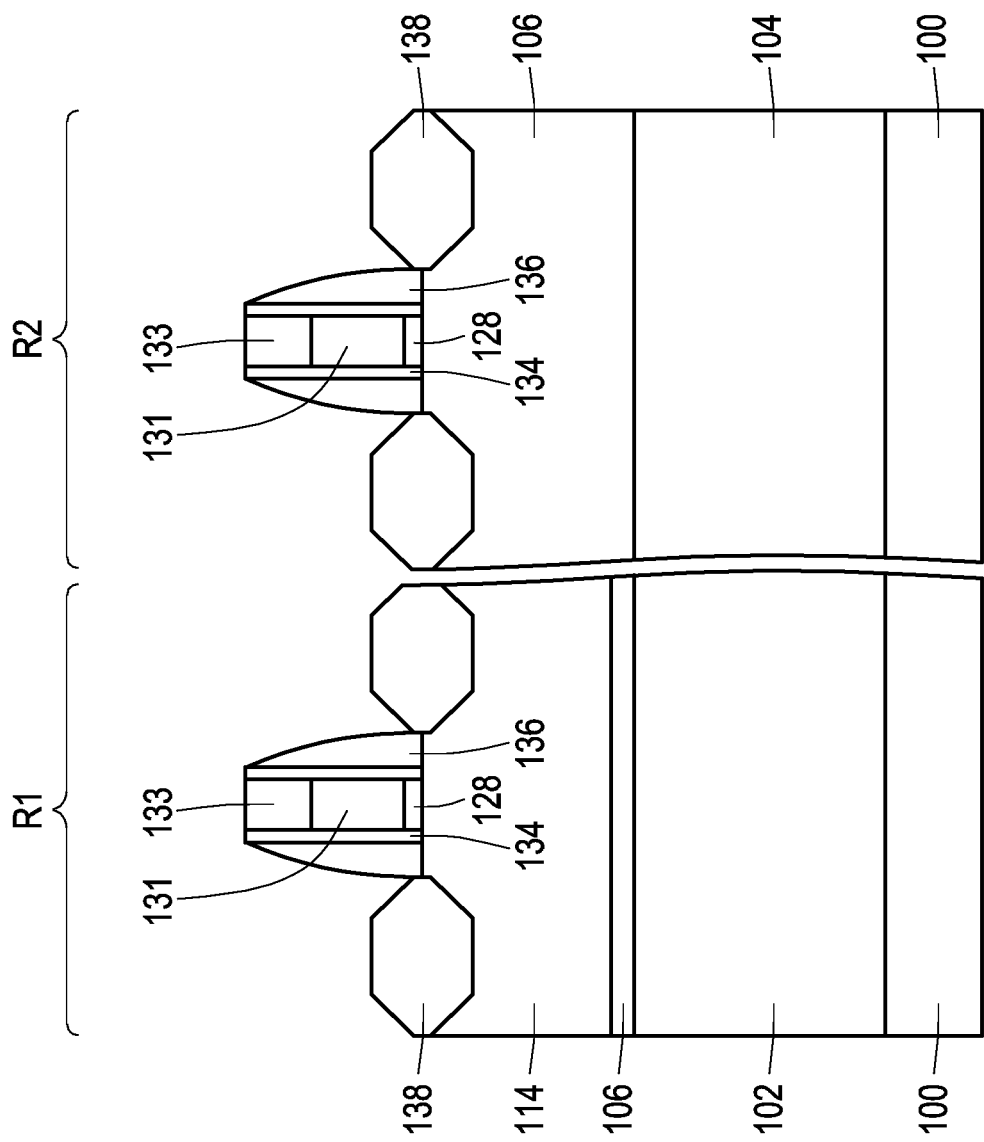
Figure 15D:
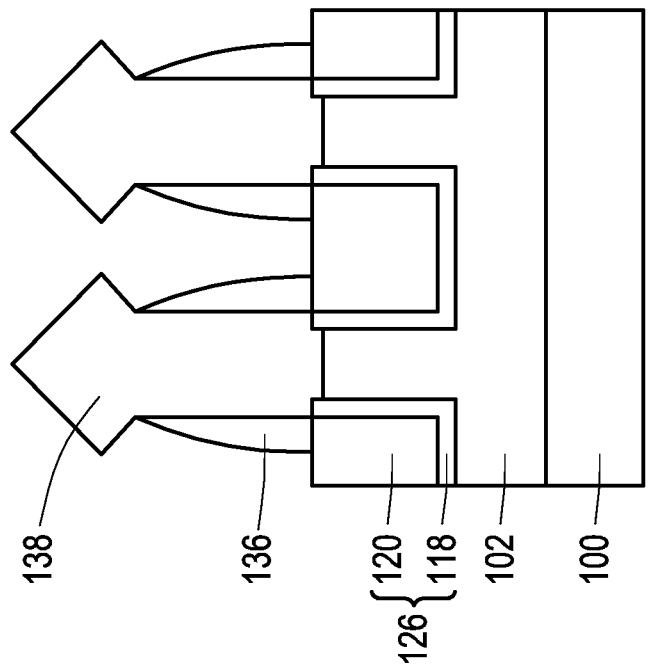
Figure 15C:
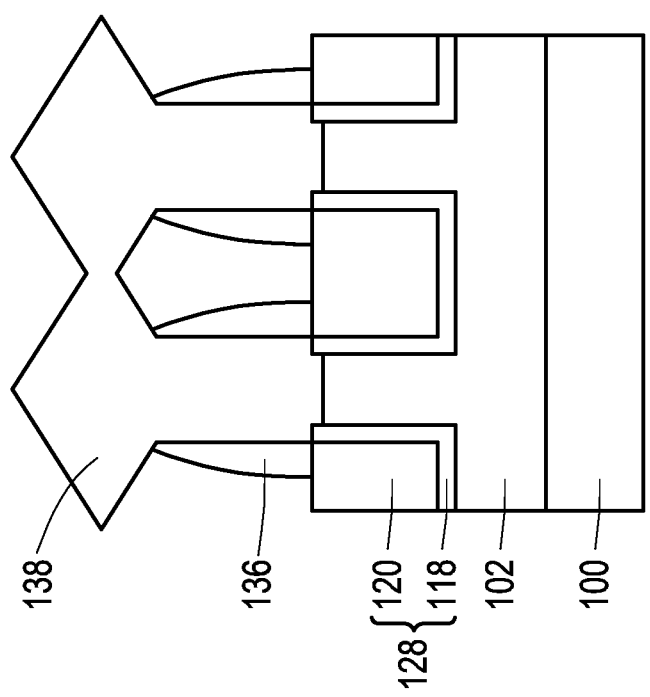
Figure 16A:
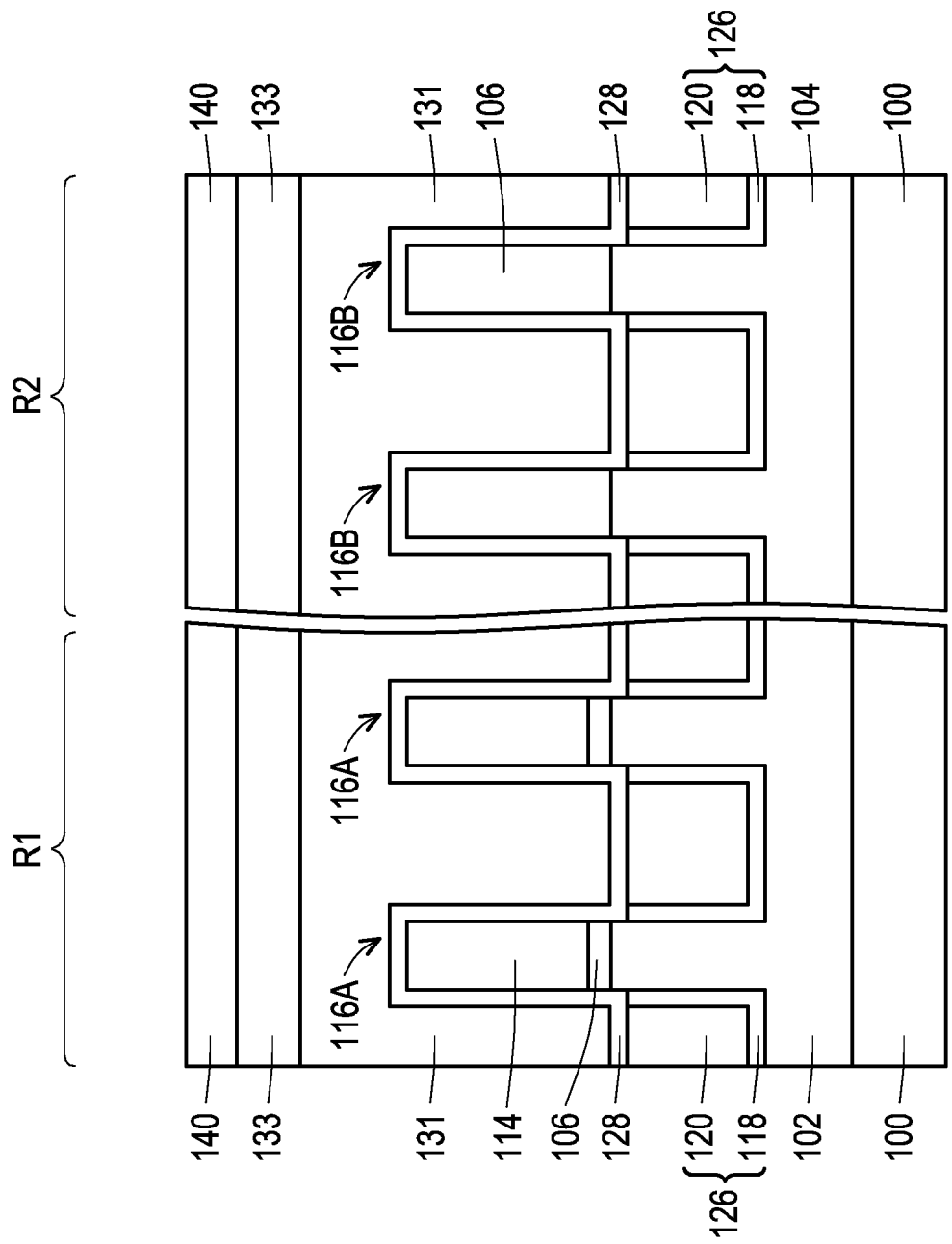
Figure 16B:
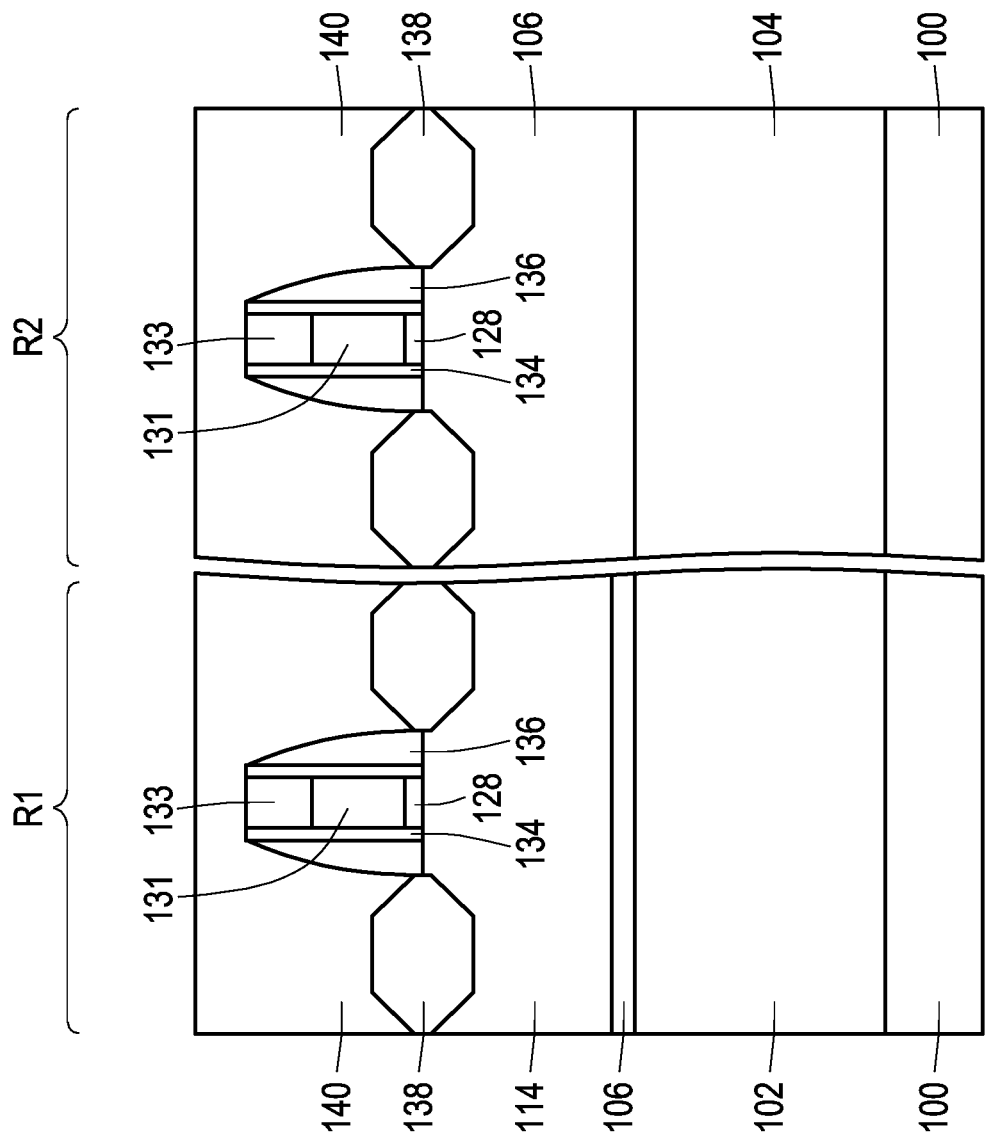

Referring to FIG. 16A and FIG. 16B, a first interlayer dielectric (ILD) 140 is deposited over the structure illustrated in FIG. 15A and FIG. 15B. The first ILD 140 may be formed of a dielectric material or a semiconductor material, and may be deposited by any suitable method, such as CVD, plasma-enhanced CVD (PECVD), or flowable CVD (FCVD). Dielectric materials may include phosphosilicate glass (PSG), borosilicate glass (BSG), boron-doped phosphosilicate glass (BPSG), undoped silicate glass (USG), or the like. Semiconductor materials may include amorphous silicon (a-Si), silicon germanium (SixGe1-x, where x may be between approximately 0 and 1), pure germanium, or the like. Other insulation or semiconductor materials formed by any acceptable process may be used. In some embodiments, a contact etch stop layer (CESL, not separately illustrated), is disposed between the first ILD 140 and the epitaxial source/drain regions 138, the masks 133, and the gate spacers 136.

Figure 17A:
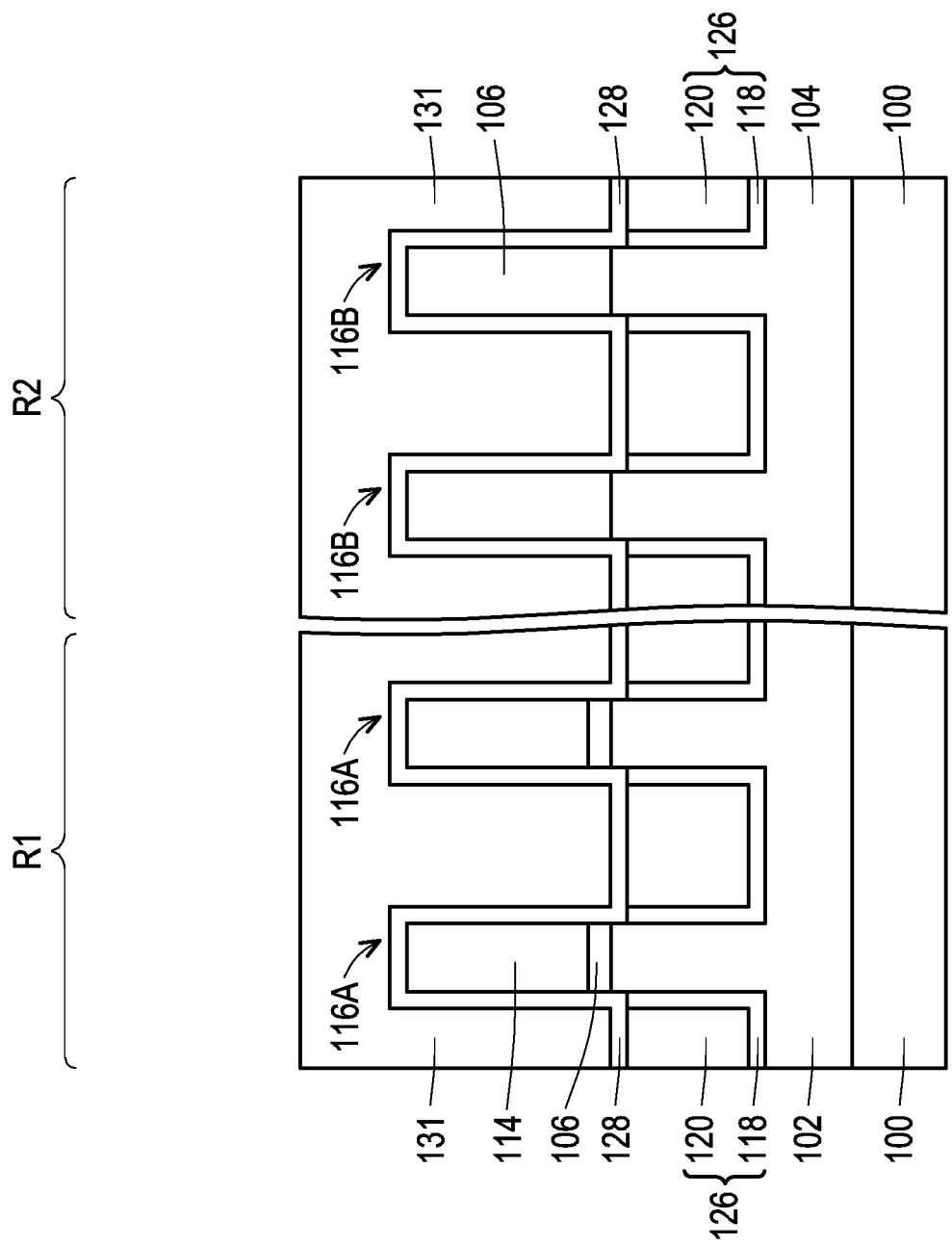
Figure 17B:
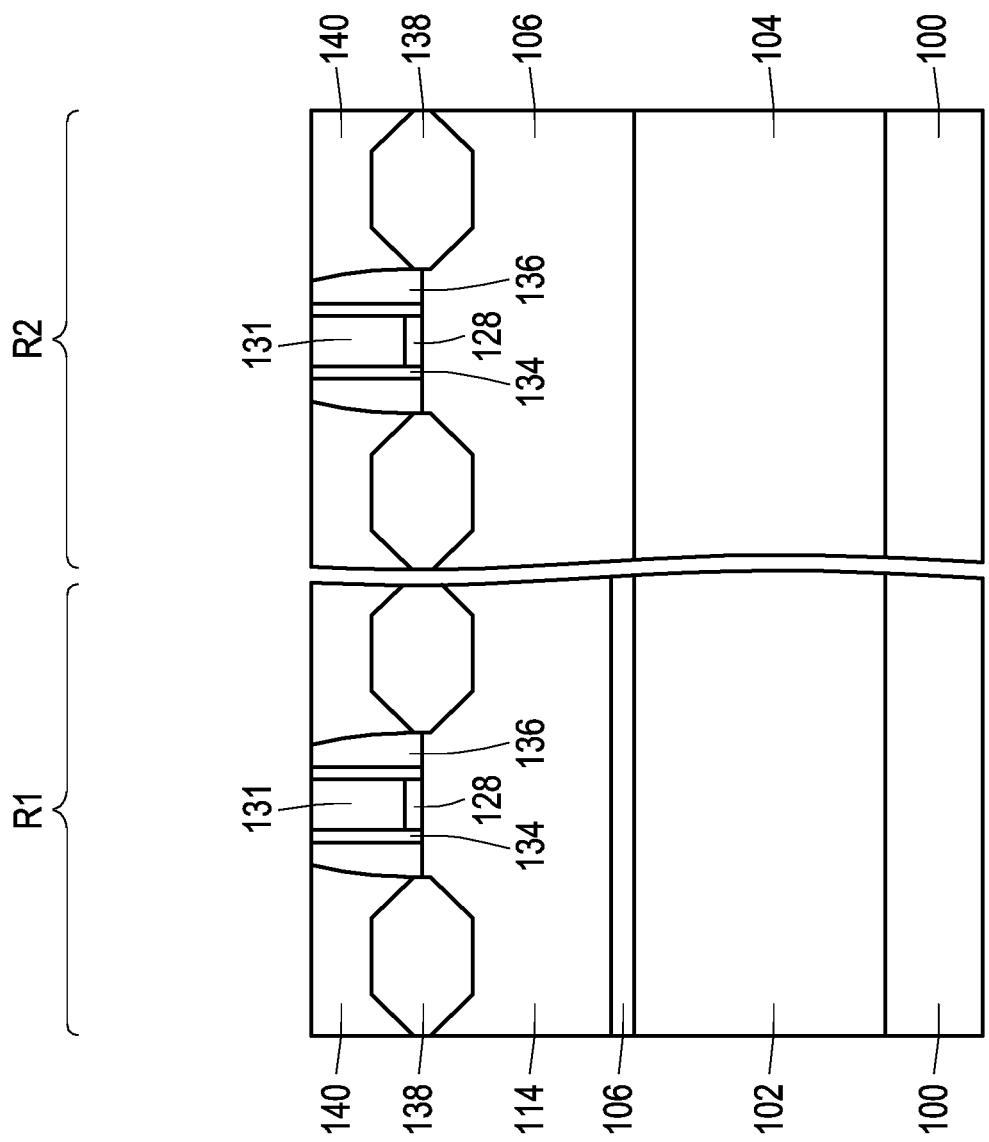

Referring to FIG. 17A and FIG. 17B, a planarization process, such as a CMP, may be performed to level the top surface of the first ILD 140 with the top surfaces of the dummy gates 131. The planarization process may also remove the masks 133 on the dummy gates 131, and portions of the gate seal spacers 134 and the gate spacers 136 disposed on the sidewalls of the masks 133. After the planarization process, top surfaces of the dummy gates 131, the gate seal spacers 134, the gate spacers 136, and the first ILD 140 are level. Accordingly, the top surfaces of the dummy gates 131 are exposed through the first ILD 140.

Figure 18A:
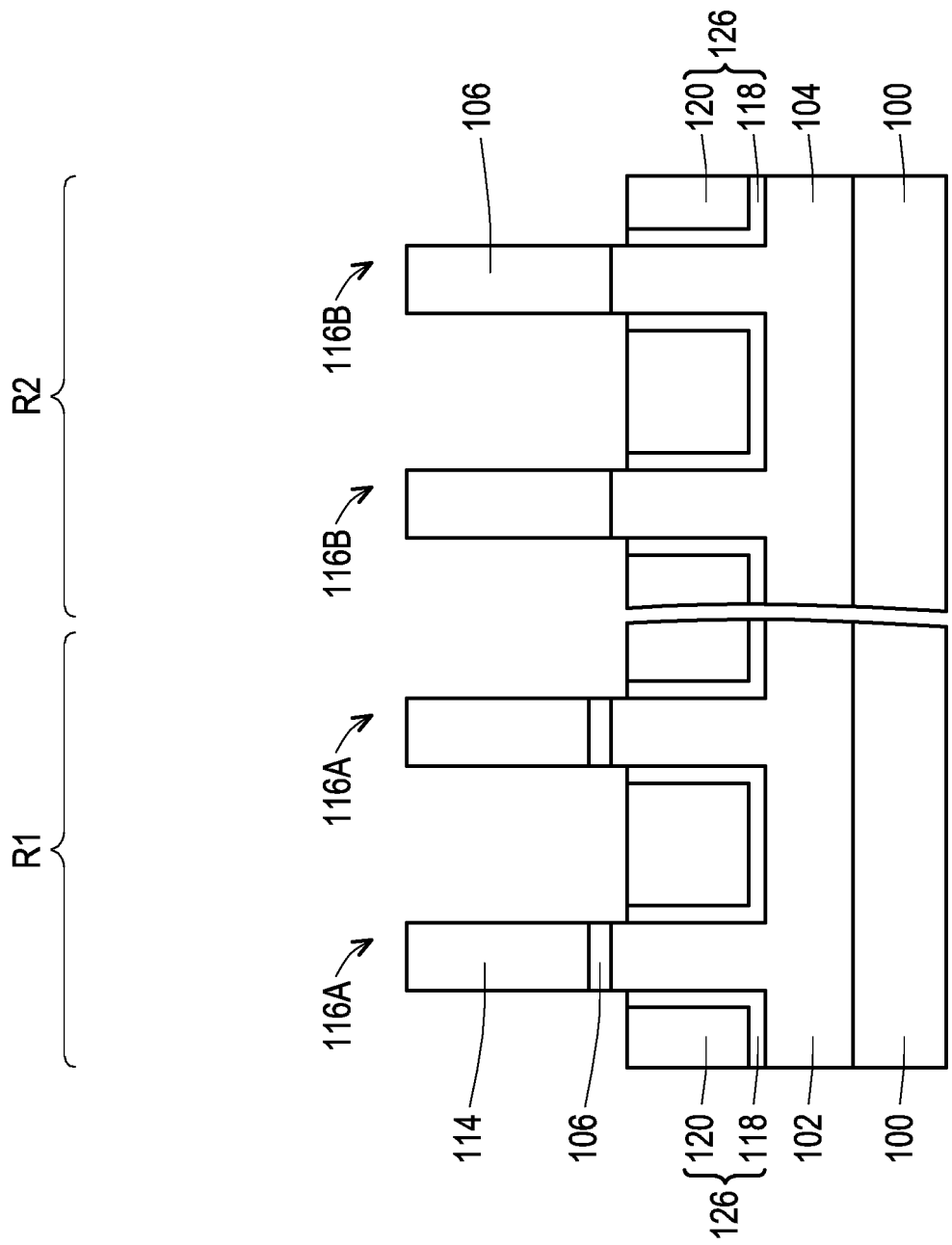
Figure 18B:
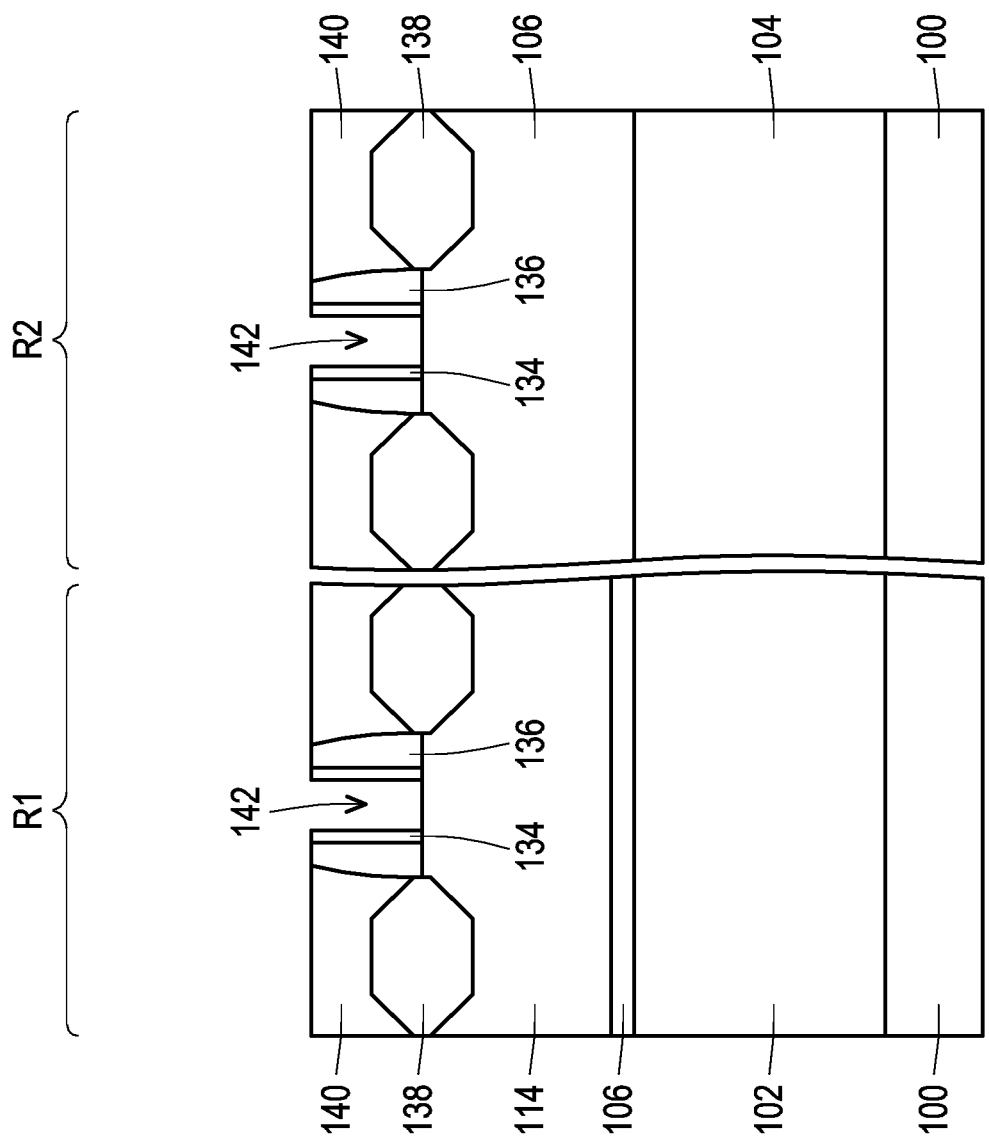

Referring to FIG. 18A and FIG. 18B, the dummy gates 131 and portions of the dummy dielectric layer 128 directly underlying the dummy gates 131 are removed in an etching step(s), so that recesses 142 are formed. In some embodiments, the dummy gates 131 are removed by an anisotropic dry etch process. For example, the etching process may include a dry etch process using reaction gas(es) that selectively etch the dummy gates 131 without etching the first ILD 140 or the gate spacers 136. Each recess 142 exposes a channel region of a respective first semiconductor fin 116A or second semiconductor fin 116B. Each channel region is disposed between neighboring pairs of the epitaxial source/drain regions 138. During the removal, the dummy dielectric layer 128 may be used as an etch stop layer when the dummy gates 131 are etched. The dummy dielectric layer 128 may then be removed after the removal of the dummy gates 131.

Figure 19A:
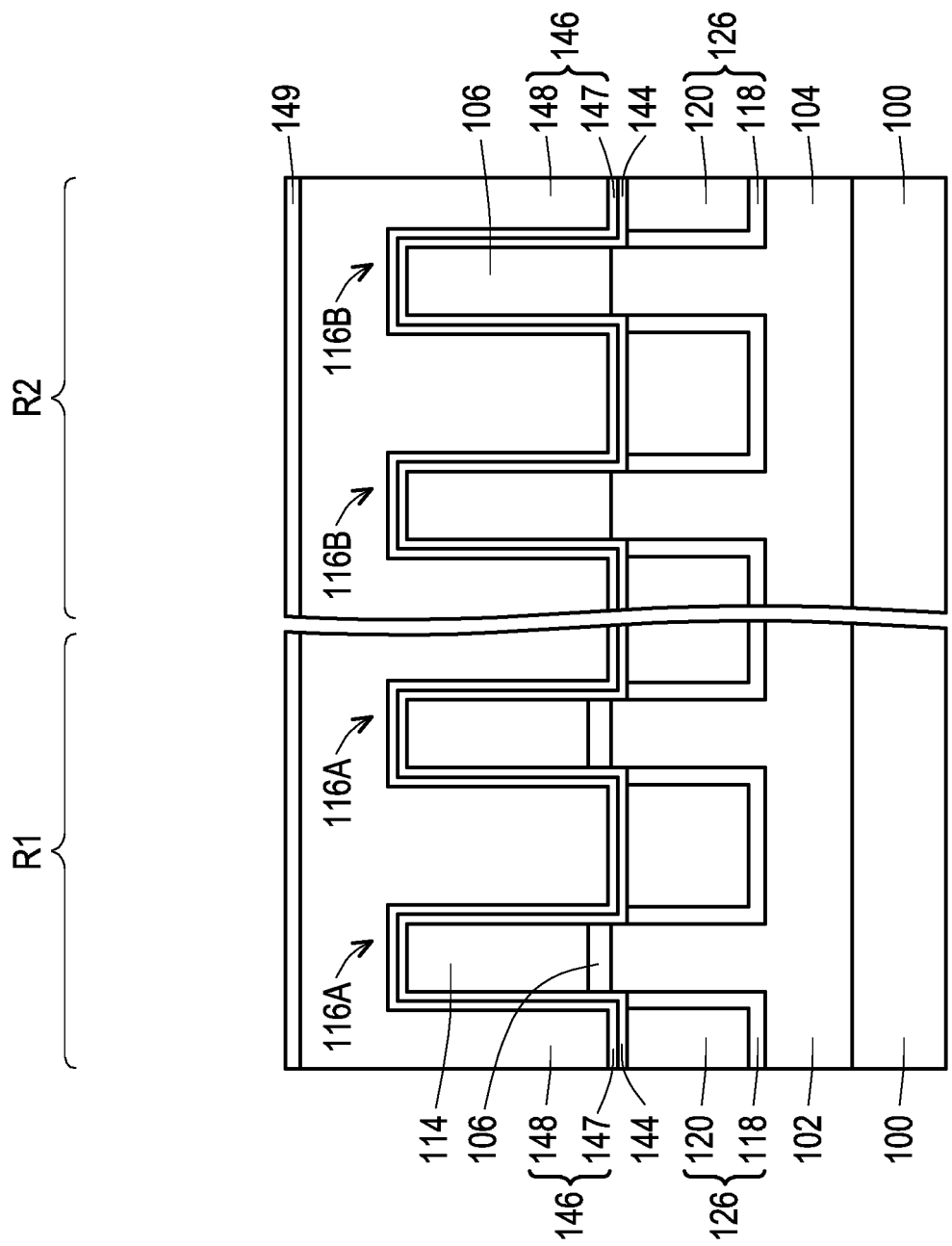
Figure 19B:
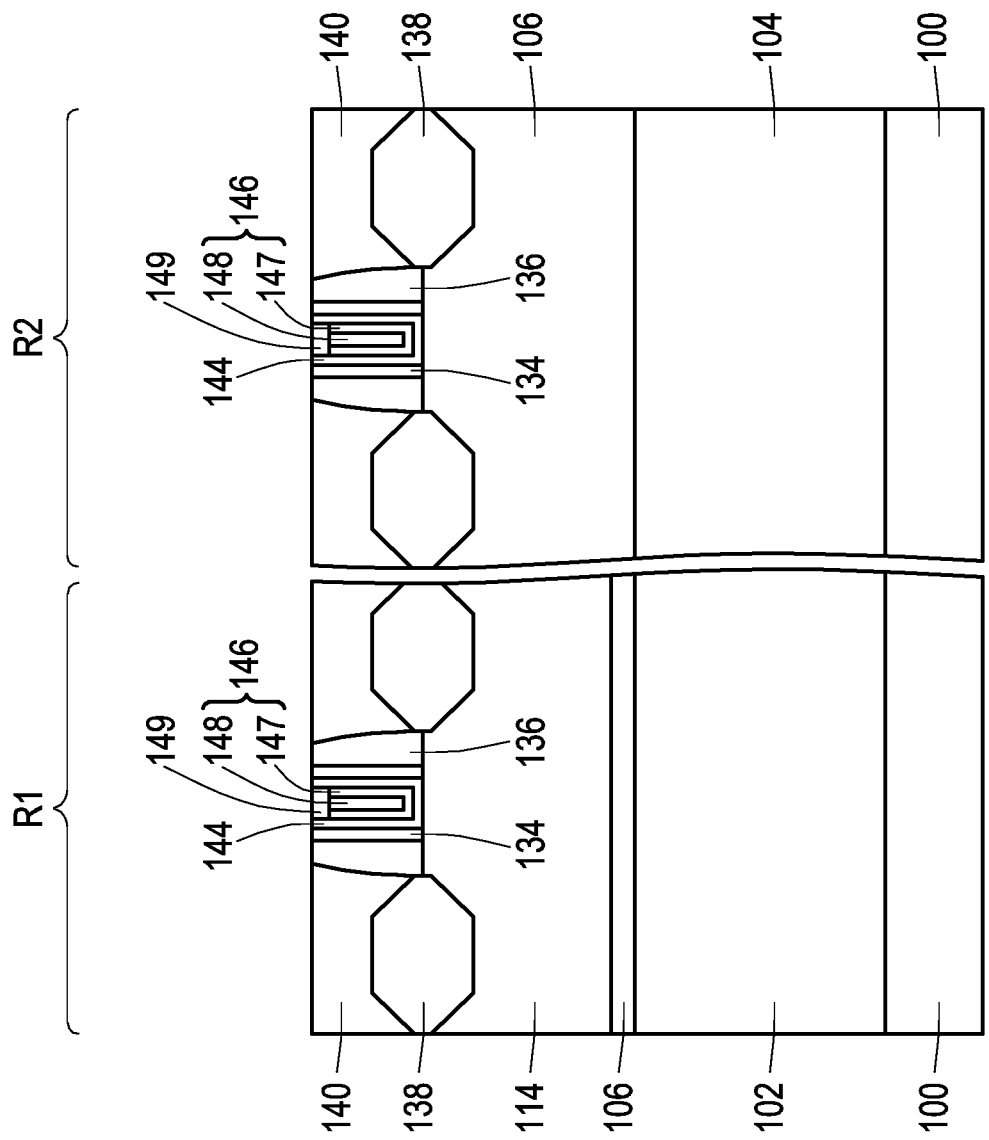

Referring to FIG. 19A and FIG. 19B, gate dielectric layers 144 and gate electrodes 146 are formed for replacement gates. The gate dielectric layers 144 are deposited conformally in the recesses 142, such as on the top surfaces and the sidewalls of the first semiconductor fins 116A and the second semiconductor fins 116B and on sidewalls of the gate seal spacers 134/gate spacers 136. The gate dielectric layers 144 may also be formed on the top surface of the first ILD 140. In accordance with some embodiments, the gate dielectric layers 144 comprise silicon oxide, silicon nitride, or multilayers thereof. In some embodiments, the gate dielectric layers 144 are a high-k dielectric material, and in these embodiments, the gate dielectric layers 144 may have a k value greater than about 7.0, and may include a metal oxide or a silicate of Hf, Al, Zr, La, Mg, Ba, Tl, Pb, and combinations thereof. The formation methods of the gate dielectric layers 144 may include molecular beam deposition (MBD), ALD, PECVD, and the like.

The gate electrodes 146 are deposited over the gate dielectric layers 144 and fill the remaining portions of the recesses 142. The gate electrodes 146 may be a metal-containing material such as TiN, TaN, TaC, Co, Ru, Al, combinations thereof, or multi-layers thereof. The gate electrodes 146 may include one or more layers of conductive material, such as a work function layer 147 and a fill material 148, as shown in FIG. 19A and FIG. 19B. After the filling of the gate electrodes 146, a planarization process, such as a CMP, may be performed to remove the excess portions of the gate dielectric layers 144 and the gate electrodes 146, which excess portions are over the top surface of the first ILD 140. The remaining portions of the gate electrodes 146 and the gate dielectric layers 144 thus form replacement gates of the resulting FinFETs. The gate electrode 146 and the corresponding gate dielectric layer 144 may be collectively referred to as a "gate" or a "gate stack." The gates and the gate stacks may extend along sidewalls of a channel region of the first semiconductor fins 116A and the second semiconductor fins 116B.

The formation of the gate dielectric layers 144 in the first region R1 and the second region R2 may occur simultaneously such that the gate dielectric layers 144 in each region are formed from the same materials, and the formation of the gate electrodes 146 may occur simultaneously such that the gate electrodes 146 in each region are formed from the same materials. However, the disclosure is not limited thereto. In some alternative some embodiments, the gate dielectric layers 144 in each region may be formed by distinct processes, such that the gate dielectric layers 144 may be different materials, and/or the gate electrodes 146 in each region may be formed by distinct processes, such that the gate electrodes 146 may be different materials. Various masking steps may be used to mask and expose appropriate regions when using distinct processes.

Further, as shown in FIG. 19A and FIG. 19B, self-aligned contacts (SACs) 149 are respectively formed on the corresponding gate electrodes 146, and thus the manufacturing process of FinFETs of the disclosure is substantially completed. After the formation of the gate electrodes 146, portions of the gate electrodes 146, such as the top portions of the work function layer 147 and the fill material 148, are removed using one or more etch processes. In some embodiments, top portions of the gate dielectric layers 144 may also be removed by the one or more etch processes. Upon removal of the top portion of the gate electrodes 146, recesses are formed between the gate dielectric layers 144. The SACs 149 are then formed in the recesses where the top portions of the gate electrodes 146 were removed. The SACs 149 protect the gate electrodes 146 during a subsequent formation of openings, which are configured to accommodate subsequently formed contacts (not illustrated). The SACs 149 may include or be an insulating material, such as silicon oxide, silicon nitride, silicon oxynitride, silicon carbon oxynitride, silicon carbon nitride, any suitable dielectric material, or any combination thereof. In some embodiments, the SACs 149 are silicon carbon oxynitride. The SACs 149 may be formed by a CVD, PVD, ALD, any suitable deposition technique, or a combination thereof, and subsequent planarization, such as a CMP.

In accordance with an embodiment, a method of manufacturing a semiconductor device comprises: forming a first semiconductor layer over a substrate, the first semiconductor layer comprising a first semiconductor material; etching the first semiconductor layer to form a first recess; forming a second semiconductor layer in the first recess, the second semiconductor layer comprising a second semiconductor material different from the first semiconductor material; etching the first semiconductor layer and the second semiconductor layer to form a first fin comprising the second semiconductor layer and the first semiconductor layer; forming an insulation material over the substrate, wherein a top surface of the insulation material is flush with a top surface of the first fin; performing an implantation process on the first fin to form an implant region near the top surface of the first fin; and partially removing the insulation material to form shallow trench isolation regions, wherein the first fin is sandwiched by two adjacent shallow trench isolation regions.

In accordance with an embodiment, a method of manufacturing a semiconductor device comprises: providing a semiconductor substrate having a plurality of first semiconductor fins in a first region and a plurality of second semiconductor fins protruding a second region from a major surface; forming an insulation material over the semiconductor substrate, wherein a top surface of the insulation material is flush with top surfaces of the first semiconductor fins and top surfaces of the second semiconductor fins; performing an implantation process on the first semiconductor fins and the second semiconductor fins to form a silicon-rich region with a depth measured from the top surfaces of the first semiconductor fins and the top surfaces of the second semiconductor fins; and partially removing the insulation material to form shallow trench isolation regions between the first semiconductor fins and the second semiconductor fins.

In accordance with an embodiment, a semiconductor device comprises a semiconductor substrate having a first region and a second region, wherein the first region comprises a plurality of first semiconductor fins and the second region comprises a plurality of second semiconductor fins, wherein the first semiconductor fins comprises silicon germanium, and each of the first semiconductor fins has wiggle curves; a plurality of shallow trench isolation regions disposed on the semiconductor substrate, wherein each of the first semiconductor fins is sandwiched by two adjacent shallow trench isolation regions and each of the second semiconductor fins is sandwiched by two adjacent shallow trench isolation regions; a plurality of gate stacks covering and in contact with a portion of each of the first semiconductor fins and a portion of each of the second semiconductor fins; and a plurality of source/drain regions covering portions of each of the first semiconductor fins revealed by the gate stacks and portions of each of the second semiconductor fins revealed by the gate stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a first semiconductor layer over a substrate, the first semiconductor layer comprising a first semiconductor material;

etching the first semiconductor layer to form a first recess;

forming a second semiconductor layer in the first recess, the second semiconductor layer comprising a second semiconductor material different from the first semiconductor material;

etching the first semiconductor layer and the second semiconductor layer to form a first fin comprising the second semiconductor layer and the first semiconductor layer;

forming an insulation material over the substrate, wherein a top surface of the insulation material is flush with a top surface of the first fin;

performing an implantation process on the first fin to form an implant region near the top surface of the first fin, wherein an implantation species for the implantation process comprises Si; and partially removing the insulation material to form shallow trench isolation regions, wherein the first fin is sandwiched by two adjacent shallow trench isolation regions.

2. The method of manufacturing a semiconductor device according to claim 1, wherein the first semiconductor material comprises silicon and the second semiconductor material comprises silicon germanium.

3. The method of manufacturing a semiconductor device according to claim 1, wherein the implant region is formed in the second semiconductor layer.

4. The method of manufacturing a semiconductor device according to claim 3, wherein a Young's modulus of the first semiconductor material is higher than a Young's modulus of the second semiconductor material, and a Young's modulus of the implant region is higher than a Young's modulus of the second semiconductor material.

5. The method of manufacturing a semiconductor device according to claim 1, wherein a depth of the implant region measured from the top surface of the first fin ranges from about 0.5 nm to about 2 nm.

6. The method of manufacturing a semiconductor device according to claim 1, during partially removing the insulation material to form the shallow trench isolation regions, the first fin has wiggle curves.

7. The method of manufacturing a semiconductor device according to claim 1, further comprising:
forming a dummy dielectric layer over the shallow trench isolation regions, wherein the implant region is converted into a portion of the dummy dielectric layer.

8. The method of manufacturing a semiconductor device according to claim 7, wherein the dummy dielectric layer is in directly contact with the first fin and the shallow trench isolation regions.

9. The method of manufacturing a semiconductor device according to claim 7, further comprising:
forming a dummy gate layer over the dummy dielectric layer;
patterning the dummy gate layer and the dummy dielectric layer to form a dummy gate stack over a portion of the first fin;
forming source/drain regions over portions of the first fin exposed by the dummy gate stack;
removing the dummy gate stack to expose the portion of the first fin; and
forming a gate dielectric layer and a gate electrode over the exposed portion of the first fin to form a gate stack.

10. A method of manufacturing a semiconductor device, comprising:
providing a semiconductor substrate having a plurality of first semiconductor fins in a first region and a plurality of second semiconductor fins protruding a second region from a major surface;
forming an insulation material over the semiconductor substrate, wherein a top surface of the insulation material is flush with top surfaces of the first semiconductor fins and top surfaces of the second semiconductor fins;
performing an implantation process on the first semiconductor fins and the second semiconductor fins to form a silicon-rich region with a depth measured from the top surfaces of the first semiconductor fins and the top surfaces of the second semiconductor fins; and
partially removing the insulation material to form shallow trench isolation regions between the first semiconductor fins and the second semiconductor fins.

11. The method of manufacturing a semiconductor device according to claim 10, wherein first semiconductor fins comprises silicon germanium.

12. The method of manufacturing a semiconductor device according to claim 11, wherein a difference between a germanium content of a rest portion of the first semiconductor fins and a germanium content of the silicon-rich region in the first semiconductor fins is about 1%.

13. The method of manufacturing a semiconductor device according to claim 10, wherein the first region is PMOS region, and the second region is NMOS region.

14. The method of manufacturing a semiconductor device according to claim 10, wherein the depth of the silicon-rich region ranges from about 0.5 nm to about 2 nm.

15. The method of manufacturing a semiconductor device according to claim 10, wherein an implantation dose of the implantation process ranges from about E13 atom/cm$^2$ to about E15 atom/cm$^2$.

16. The method of manufacturing a semiconductor device according to claim 10, wherein a top surface of the silicon-rich region in the first semiconductor fins is substantially flush with a top surface of the silicon-rich region in the second semiconductor fins.

17. The method of manufacturing a semiconductor device according to claim 10, further comprising:
forming a dummy dielectric layer over the shallow trench isolation regions, wherein the silicon-rich region is converted into a portion of the dummy dielectric layer.

18. A semiconductor device, comprising:
a semiconductor substrate having a first region and a second region, wherein the first region comprises a plurality of first semiconductor fins and the second region comprises a plurality of second semiconductor fins, wherein the first semiconductor fins comprise silicon germanium, and each of the first semiconductor fins has wiggle curves;
a plurality of shallow trench isolation regions disposed on the semiconductor substrate, wherein each of the first semiconductor fins is sandwiched by two adjacent shallow trench isolation regions and each of the second semiconductor fins is sandwiched by two adjacent shallow trench isolation regions;
a plurality of gate stacks covering and in contact with a portion of each of the first semiconductor fins and a portion of each of the second semiconductor fins, wherein each of the gate stacks comprises a gate electrode and a gate dielectric layer, and the gate dielectric layers of the gate stacks are in contact with the portion of each of the first semiconductor fins and the portion of each of the second semiconductor fins; and
a plurality of source/drain regions covering portions of each of the first semiconductor fins revealed by the gate stacks and portions of each of the second semiconductor fins revealed by the gate stacks.

19. The semiconductor device according to claim 18, wherein a height difference between each of the first semiconductor fins and each of the second semiconductor fins ranges from 0 to 3 nm.

20. The semiconductor device according to claim 18, wherein a ratio of a maximum space between two adjacent first semiconductor fins and a minimum space between two adjacent first semiconductor fins is about 15%.

* * * * *